(12) United States Patent
Ogata et al.

(10) Patent No.: US 10,484,796 B2
(45) Date of Patent: Nov. 19, 2019

(54) SPEAKER DEVICE AND METHOD FOR MANUFACTURING SPEAKER DEVICE

(71) Applicant: DAI-ICHI SEIKO CO., LTD., Kyoto-shi, Kyoto (JP)

(72) Inventors: Kenji Ogata, Ogori (JP); Shogo Kurogi, Ogori (JP); Yoshiyuki Watanabe, Takasaki (JP)

(73) Assignee: DAI-ICHI SEIKO CO., LTD., Kyoto (JP)

( * ) Notice: Subject to any disclaimer, the term of this patent is extended or adjusted under 35 U.S.C. 154(b) by 0 days.

(21) Appl. No.: 16/063,943

(22) PCT Filed: Dec. 16, 2016

(86) PCT No.: PCT/JP2016/087513
§ 371 (c)(1),
(2) Date: Jun. 19, 2018

(87) PCT Pub. No.: WO2017/110666
PCT Pub. Date: Jun. 29, 2017

(65) Prior Publication Data
US 2019/0268702 A1    Aug. 29, 2019

(30) Foreign Application Priority Data

Dec. 25, 2015    (JP) .................. 2015-254860

(51) Int. Cl.
*H04R 17/10*    (2006.01)
*H04R 31/00*    (2006.01)
(Continued)

(52) U.S. Cl.
CPC ............. *H04R 17/10* (2013.01); *H04R 31/00* (2013.01); *H01L 41/081* (2013.01);
(Continued)

(58) Field of Classification Search
CPC ........ H04R 17/10; H04R 31/00; H04R 17/00; H01L 41/332; H01L 41/316;
(Continued)

(56) References Cited

U.S. PATENT DOCUMENTS 6,396,197 B1 * 5/2002 Szilagyi .................. A42B 3/30
                                                        310/328
2006/0072772 A1 * 4/2006 Melman ................. H04R 1/345
                                                        381/190
(Continued)

FOREIGN PATENT DOCUMENTS

JP    61-253996    11/1986
JP    11-285096    10/1999
(Continued)

OTHER PUBLICATIONS

Written Opinion dated Mar. 7, 2017.

*Primary Examiner* — Tuan D Nguyen
(74) *Attorney, Agent, or Firm* — Howard & Howard Attorneys PLLC

(57) ABSTRACT

An array speaker device (1A) includes a vibrator (20) arranged on one face of a substrate having a uniform thickness, the vibrator being formed of a base material layer (11), a first electrode layer (12), a piezoelectric element layer (13), and a second electrode layer (14), each of which has a uniform thickness, and which are layered in the order mentioned on the substrate. A hole through which a sound wave is outputted in the thickness direction of the substrate is provided on the substrate at a position corresponding to the vibrator (20), the sound wave being generated by vibration of the vibrator (20) to which a voltage signal is applied via the first electrode layer (12) and the second electrode layer (14). Scallops (S) made of an indentation and a projection alternating in the thickness direction of the sub- (Continued)

strate are formed on the inner circumferential wall of the hole.

15 Claims, 32 Drawing Sheets

(51) Int. Cl.
  *H01L 41/08* (2006.01)
  *H01L 41/187* (2006.01)
  *H01L 41/316* (2013.01)
  *H01L 41/332* (2013.01)

(52) U.S. Cl.
  CPC ........ *H01L 41/1876* (2013.01); *H01L 41/316* (2013.01); *H01L 41/332* (2013.01)

(58) Field of Classification Search
  CPC ... H01L 41/1876; H01L 41/081; H01L 41/09; B81B 3/00; B81B 7/04; B81C 1/00
  See application file for complete search history.

(56) References Cited

U.S. PATENT DOCUMENTS

| | | | | |
|---|---|---|---|---|
| 2010/0278368 | A1* | 11/2010 | Martin | H04R 1/30 381/340 |
| 2011/0122731 | A1* | 5/2011 | Buccafusca | G10K 9/122 367/162 |
| 2013/0127300 | A1* | 5/2013 | Umeda | H01L 41/18 310/365 |

FOREIGN PATENT DOCUMENTS

| | | |
|---|---|---|
| JP | 2005-303532 | 10/2005 |
| JP | 2008-020429 | 1/2008 |
| JP | 2011-182298 | 9/2011 |
| JP | 2011-182299 | 9/2011 |
| JP | 2012-100043 | 5/2012 |
| JP | 2012-165308 | 8/2012 |
| JP | 2013-157740 | 8/2013 |
| JP | 2013-172237 | 9/2013 |
| JP | 2013-183384 | 9/2013 |

* cited by examiner

SPEAKER DEVICE AND METHOD FOR MANUFACTURING SPEAKER DEVICE

CROSS-REFERENCE TO RELATED APPLICATIONS

The present application is a U.S. National Phase of International Application No. PCT/JP2016/087513, filed on Dec. 16, 2016, which claims the benefit of Japanese Patent Application No. 2015-254860, filed on Dec. 25, 2015, the disclosures of which are hereby incorporated by reference in their entirety.

TECHNICAL FIELD

The present disclosure relates to a speaker device and a method for manufacturing a speaker device.

BACKGROUND ART

Conventional speaker devices that have been disclosed include a speaker device in which piezoelectric vibrators are arranged to emit sound waves generated through vibration (see Patent Literature 1, for example). In this speaker device, a plurality of piezoelectric vibrators is attached to a substrate in such a way that each piezoelectric vibrator is pressed against a support member as much as possible so that the piezoelectric vibrators are uniform in height and orientation from the substrate to the extent possible. This can reduce variations in orientation and phase shifts in sound waves emitted by each piezoelectric vibrator, resulting in increased directivity.

CITATION LIST

Patent Literature

Patent Literature 1: Unexamined Japanese Patent Application Kokai Publication No. 2013-157740.

SUMMARY OF INVENTION

Technical Problem

In the speaker device described above, the uniformity of piezoelectric vibrators in height and orientation from a substrate depends on the extent to which each piezoelectric vibrator is pressed. However, the extent of the pressing may be variable, and thus it is difficult to make piezoelectric vibrators uniform in shape, size, and orientation on the order of microns so as to increase the directivity.

The present disclosure has been created in view of the foregoing circumstances, and an objective of the disclosure is to provide a speaker device that can achieve higher directivity and a method for manufacturing the speaker device.

Solution to Problem

To achieve the above-described objective, an array speaker device according to a first aspect of the present disclosure includes:

a substrate having a uniform thickness; and a vibrator arranged on one face of the substrate, the vibrator including a base material layer, a first electrode layer, a piezoelectric element layer, and a second electrode layer, each of which has a uniform thickness, and which are layered in an order mentioned, wherein a hole through which a sound wave is outputted in a thickness direction of the substrate is provided on another face of the substrate at a position corresponding to the vibrator, the sound wave being generated by vibration of the vibrator to which a voltage signal is applied via the first electrode layer and the second electrode layer, and wherein scallops made of an indentation and a projection alternating in the thickness direction of the substrate are formed on an inner circumferential wall of the hole.

The speaker device may include:

a resonator that resonates with the vibration of the vibrator and makes the sound wave outputted in the thickness direction of the substrate closer to a plane parallel to the substrate; and an attachment portion which is provided at a center of the hole and to which the resonator is attached, wherein scallops facing the scallops formed on the inner circumferential wall of the hole may be formed on an outer circumferential wall of the attachment portion.

Both the hole and the attachment portion may be cylindrical, the attachment portion may be disposed concentrically with the hole, and the resonator may be in a form of a cone tapered toward the vibrator and may be disposed concentrically with the hole and the attachment portion.

The second electrode layer may be in a circular shape and may be disposed concentrically with the hole, the attachment portion, and the resonator.

The speaker device may include a plurality of the vibrators, and the hole may be provided at a position corresponding to each of a plurality of the vibrators.

The vibrators may be arranged at intersections of lines forming a square grid on the substrate.

One vibrator may be disposed at a center of a circle and surrounding vibrators may be equally spaced on a circumference of the circle.

The vibrators may be arranged so that three vibrators adjacent to one another are positioned at vertices of an equilateral triangle on the substrate.

A projection and an indentation may be provided on an outer edge of the substrate, which is to abut on an outer edge of another adjacent substrate, so as to be engaged with a projection and an indentation on the outer edge of the other substrate when a plurality of the substrates is tiled, and the vibrator may be provided on the projection of the outer edge so that three vibrators adjacent to one another across the substrates are positioned at vertices of a congruent equilateral triangle with the equilateral triangle.

The speaker device may include:

a first external terminal being an external terminal for the first electrode layer;

a wiring pattern formed on the substrate so as to electrically connect the second electrode layers that are included in the vibrators arranged on one face of the substrate; and a second external terminal being an external terminal for the wiring pattern, wherein, when a plurality of the substrates is tiled, the first external terminal may be provided at a position opposite to the first external terminal provided on another adjacent substrate, and wherein, when a plurality of the substrates is tiled, the second external terminal may be provided at a position opposite to the second external terminal provided on another adjacent substrate.

The speaker device may be fastened to a fastening target through part of the piezoelectric element layer being exposed on one face of the substrate.

The speaker device may be fastened to the fastening target through a circular or rectangular portion disposed at an intersection of lines forming a two-dimensional grid that is formed to circumvent the second electrode layer.

The speaker device may be fastened to the fastening target through an entire portion that is formed to circumvent the second electrode layer.

The speaker device may be fastened to the fastening target through a portion in a form of a two-dimensional grid that is formed to circumvent the second electrode layer.

A method for manufacturing an array speaker device according to a second aspect of the present disclosure includes the steps of:

depositing a first electrode layer on a base material layer that serves as an active layer in a silicon-on-insulator (SOI) substrate;

depositing a piezoelectric element layer on the first electrode layer;

depositing a second electrode layer on the piezoelectric element layer;

forming a vibrator that includes the base material layer, the first electrode layer, the piezoelectric element layer, and the second electrode layer on one face of the substrate through etching; and flipping the substrate, and forming a hole, through which a sound wave is outputted in a thickness direction of the substrate, at a position corresponding to the vibrator through deep etching performed on another face of the substrate, the sound wave being generated by vibration of the piezoelectric element layer to which a voltage signal is applied via the first electrode layer and the second electrode layer.

Advantageous Effects of Invention

According to the present disclosure, a vibrator and a hole are formed on a substrate by using a semiconductor manufacturing technique, the hole being intended for outputting in the thickness direction of the substrate a sound wave generated by vibration of the vibrator. Hence, a speaker including the vibrator and the hole can be more uniform in shape, size, and orientation. As a result, higher directivity can be achieved.

DESCRIPTION OF EMBODIMENTS

Embodiments of the present disclosure will now be described in detail with reference to the drawings.

Embodiment 1

The following describes Embodiment 1 of the present disclosure.

Figure 1A:
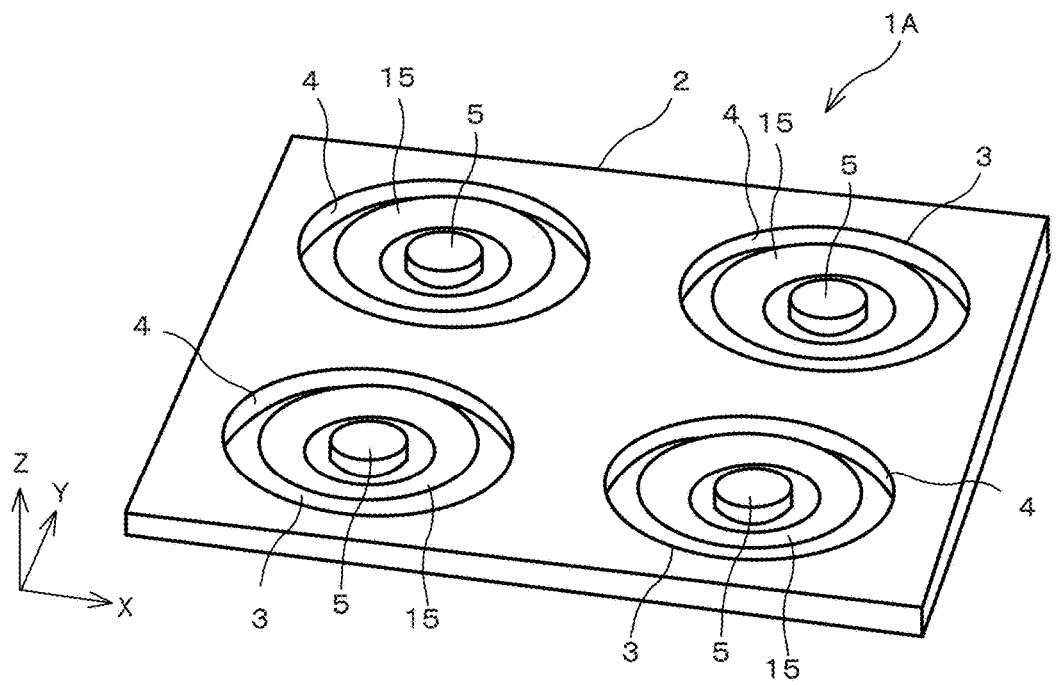
FIG. 1A is a perspective view of an array speaker device according to Embodiment 1 of the present disclosure.
Figure 1B:
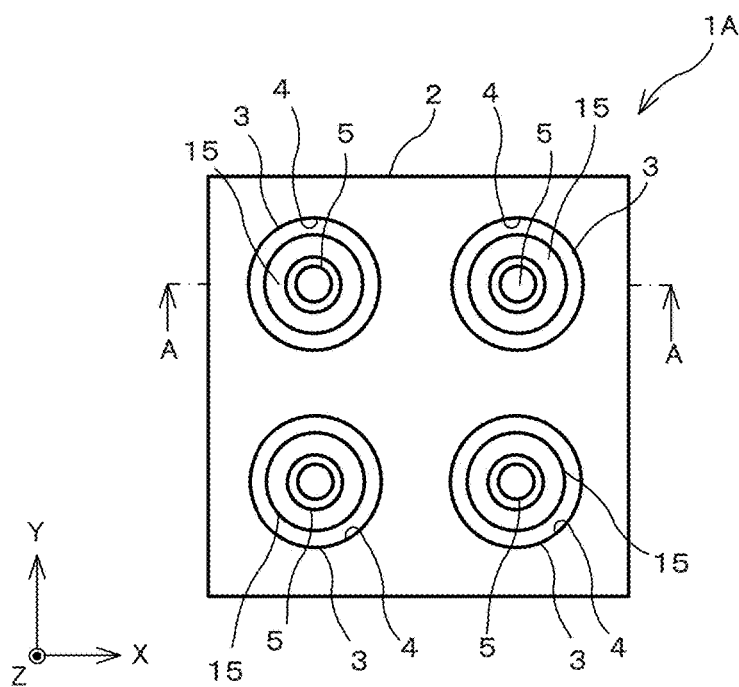
FIG. 1B is a top view of the array speaker device in FIG. 1A.

As illustrated in FIGS. 1A and 1B, an array speaker device 1A includes a substrate 2, which is a substrate supporting the entire device, and a plurality of speaker portions 3 arranged in two rows by two columns on the substrate 2. Each speaker portion 3 outputs sound waves in the thickness direction, namely in the +Z direction, of the substrate 2. The individual speaker portions 3 are produced with the micro-electromechanical systems (MEMS) technology, which is semiconductor manufacturing technology, to be uniform in shape, size, and orientation, and thus have high directivity. Note that sound waves include ultrasound as well as voices and musical sounds.

The substrate 2 is a square-shaped flat plate having a uniform thickness, formed of silicon (Si), for example. The substrate 2 has a thickness of about 500 μm, for example.

As illustrated in FIG. 1B, the speaker portions 3 are arranged on the substrate 2 at the respective vertices of a square geometrically similar to the substrate 2. Thus, the speaker portions 3 are arranged along the X-axis direction at the same intervals as the speaker portions 3 arranged along the Y-axis direction.

A hole 4 is provided at a position corresponding to each speaker portion 3. Each hole 4 is cylindrical so as to output a sound wave generated at the speaker portion 3 in the thickness direction of the substrate 2. At the center of each hole 4, there is provided an attachment portion 5 where a cup 15, which is described later, is to be attached. The attachment portion 5 is a cylindrical member disposed concentrically with the hole 4.

Figure 2:
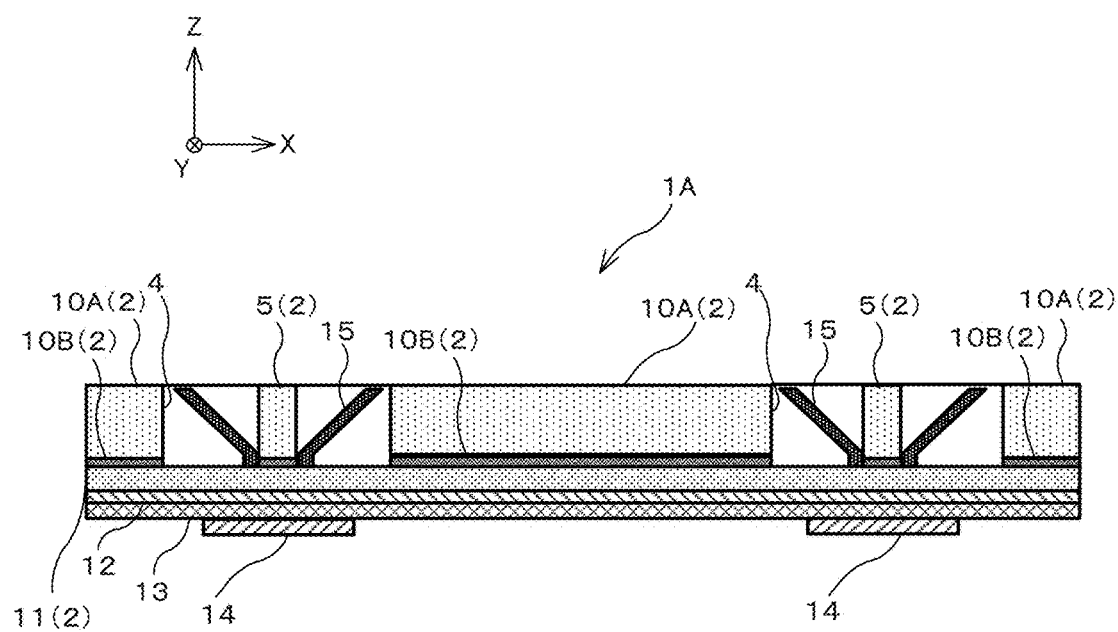
FIG. 2 is a cross-sectional view of the array speaker device taken along A-A in FIG. 1B.

As illustrated in FIG. 2, which is a cross-sectional view taken along A-A in FIG. 1B, the substrate 2 is formed of a silicon-on-insulator (SOI) substrate that includes a support layer 10A, a buried oxide (BOX) layer 10B, and a base material layer 11. The support layer 10A is formed of silicon (Si) and has a thickness of, for example, 525 μm. The BOX layer 10B is formed of a silicon dioxide film ($SiO_2$) and has a thickness of, for example, several micrometers. The base material layer 11 is formed of silicon (Si). The base material layer 11, which may also be called an Si active layer, has a thickness of, for example, 150 μm. An SOI substrate is used for semiconductor manufacturing, having layers each of which has a uniform thickness.

As illustrated in FIG. 2, the array speaker device 1A includes a first electrode layer 12, a piezoelectric element layer 13, a second electrode layer 14, and a cup 15, in addition to the support layer 10A, the attachment portion 5, the BOX layer 10B, and the base material layer 11. With reference to FIG. 2, from bottom to top, the second electrode layer 14, the piezoelectric element layer 13, the first electrode layer 12, the base material layer 11, the BOX layer 10B, and the support layer 10A (attachment portion 5) are layered in the order mentioned. The second electrode layer 14, the piezoelectric element layer 13, the first electrode layer 12, the base material layer 11, the BOX layer 10B, and the support layer 10A (attachment portion 5) each have a uniform thickness.

The first electrode layer 12 is formed of an electrically conductive member such as platinum or gold, and has a thickness of 1 μm or less. The first electrode layer 12 is formed all over the substrate 2.

The piezoelectric element layer 13 is formed of a piezoelectric material to cause electrostriction under the application of a voltage, and has a thickness of several micrometers. When a voltage signal is given, the piezoelectric element layer 13 expands or contracts. Examples of an employed piezoelectric material include lead zirconate titanate (Pb (Zr, Ti) $O_3$: PZT).

The second electrode layer 14 is formed of an electrically conductive member such as platinum or gold, and has a thickness of 1 μm or less. The second electrode layer 14 is provided for each of the speaker portions 3. The second electrode layer 14 is in a circular shape and is disposed concentrically with the hole 4, the attachment portion 5, and the cup 15.

Figure 3:
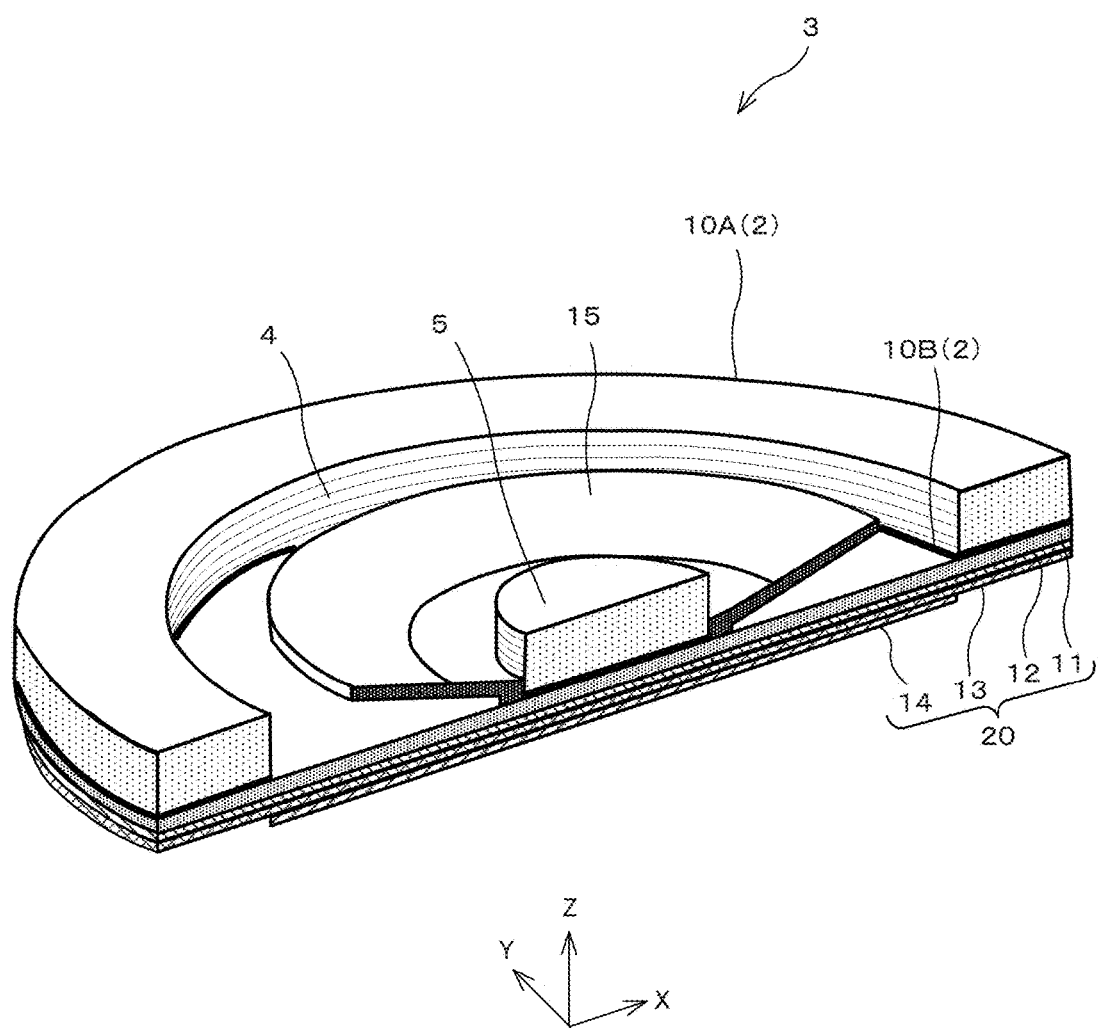
FIG. 3 is a perspective cross-sectional view of an enlarged speaker portion.

In the present embodiment, as illustrated in FIG. 3, the vibrator 20 is formed by layering the base material layer 11, the first electrode layer 12, the piezoelectric element layer 13, and the second electrode layer 14, each of which has a uniform thickness, in the order mentioned. The vibrator 20 is attached on the side of one face (−Z face) of the substrate 2. The speaker portion 3 is formed by attaching the BOX layer 10B, the support layer 10A (including the attachment portion 5), and the cup 15 on the vibrator 20.

The cup 15 is a resonator that resonates with the vibration produced by the vibrator 20 to make the wavefront of a sound wave, as outputted in the thickness direction of the substrate 2, closer to a plane parallel to the substrate 2. The cup 15 is tapered toward the bottom of the hole 4. In other words, the cup 15 is in the form of a cone tapered toward the vibrator 20, and is disposed concentrically with the hole 4 and the attachment portion 5. The cup 15 is formed of, for example, aluminum or an aluminum alloy, and has a resonant frequency of 40 kHz. A frequency band around 40 kHz is out of the human audible range, and thus regarded as a band having no effect on acoustics.

Figure 4:
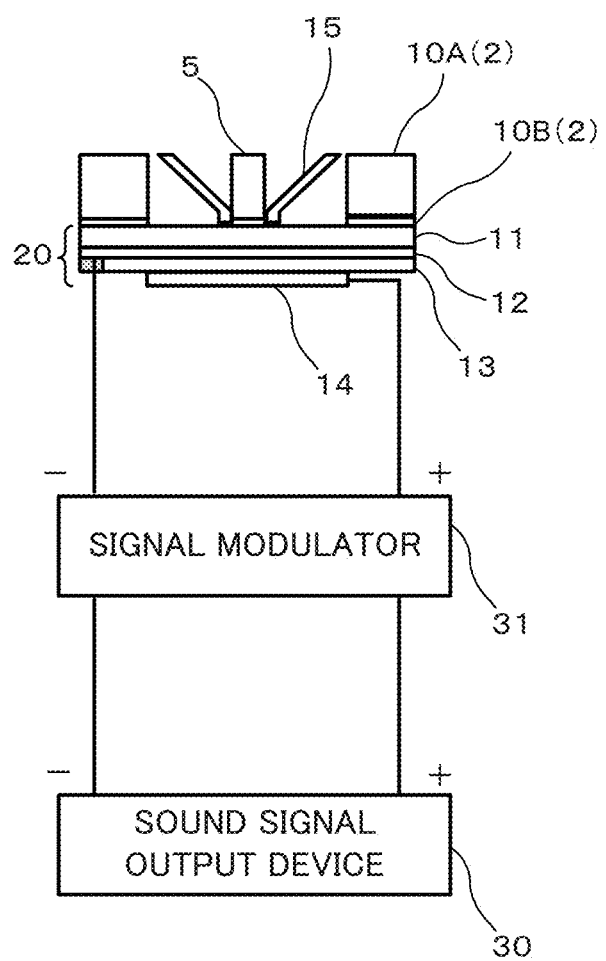
FIG. 4 is a block diagram illustrating a signal system connected to the array speaker device.

A signal system is connected to the speaker portion 3 for supplying a voltage signal corresponding to the sound to be reproduced. As illustrated in FIG. 4, the signal system includes a sound signal output device 30 and a signal modulator 31.

The sound signal output device 30 outputs a voltage signal corresponding to the sound to be reproduced by the array speaker device 1A. The frequency of the voltage signal falls within an audible range.

The signal modulator 31 modulates the voltage signal outputted by the sound signal output device 30 with a predetermined modulation frequency. Examples of an employed predetermined modulation frequency include a frequency around 40 kHz, which is the resonant frequency of the cup 15. Examples of an employed modulation method for the signal modulator 31 include amplitude modulation (AM).

The voltage signal modulated by the signal modulator 31 is applied to the vibrator 20 as a voltage signal between the second electrode layer 14 and the first electrode layer 12. This voltage signal causes the vibrator 20 to vibrate and a sound wave is generated.

Figure 5A:
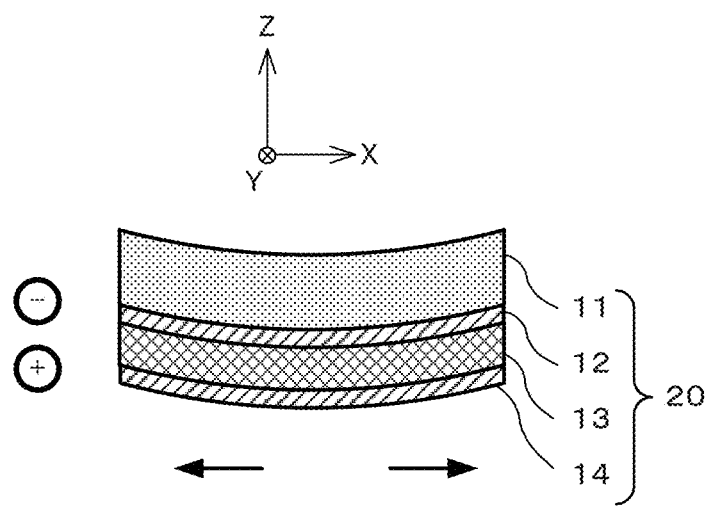
FIG. 5A illustrates movement (part 1) of a vibrator when a voltage is applied thereto.

For example, when a positive voltage is applied to the second electrode layer 14 while a negative voltage is applied to the first electrode layer 12 as seen in FIG. 5A, the piezoelectric element layer 13 expands in the XY directions indicated by arrows. However, since the base material layer 11 does not expand, the vibrator 20 is curved to project in the −Z direction.

Figure 5B:
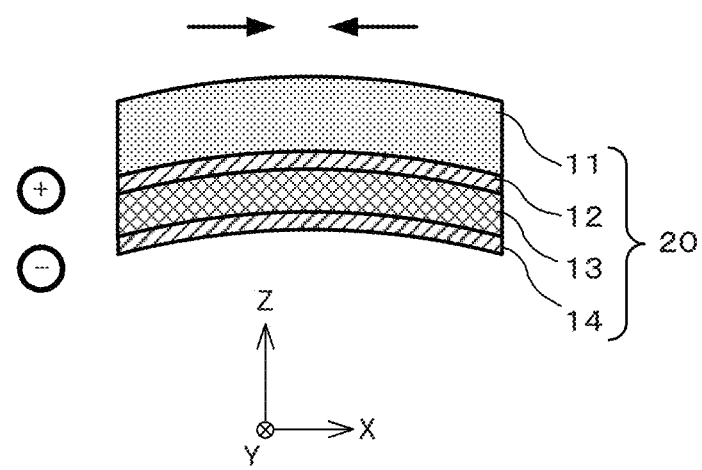
FIG. 5B illustrates movement (part 2) of a vibrator when a voltage is applied thereto.

In contrast, when a negative voltage is applied to the second electrode layer 14 while a positive voltage is applied to the first electrode layer 12 as seen in FIG. 5B, the piezoelectric element layer 13 contracts in the XY directions indicated by arrows. However, since the base material layer 11 does not contract, the vibrator 20 is curved to project in the +Z direction.

Note that the piezoelectric element layer 13 may expand or contract in the direction opposite to that described above in response to an applied voltage, depending on the polarity of piezoelectric element layer 13. If this is the case, the vibrator 20 is curved in the direction opposite to that indicated in FIGS. 5A and 5B.

The foregoing voltage signal oscillates between a positive voltage and a negative voltage. Thus, in response to such voltage signals, the vibrator 20 alternates between the states illustrated in FIGS. 5A and 5B to vibrate. Such vibration generates a sound wave.

The hole 4 is provided at a position corresponding to the vibrator 20. A sound wave generated by vibration of the vibrator 20, to which a voltage signal is applied via the first and second electrode layers 12 and 14, travels through the hole 4 in the thickness direction of the substrate 2. At this time, the cup 15 attached to the attachment portion 5 resonates with the vibration of the vibrator 20, and transforms the spherical sound wave generated by vibration of the vibrator 20 into a plane wave having a wavefront parallel to an X-Y plane. The sound wave (plane wave) with its wavefronts transformed by the cup 15 is outputted from the hole 4 and travels in the +Z direction.

Figure 6:
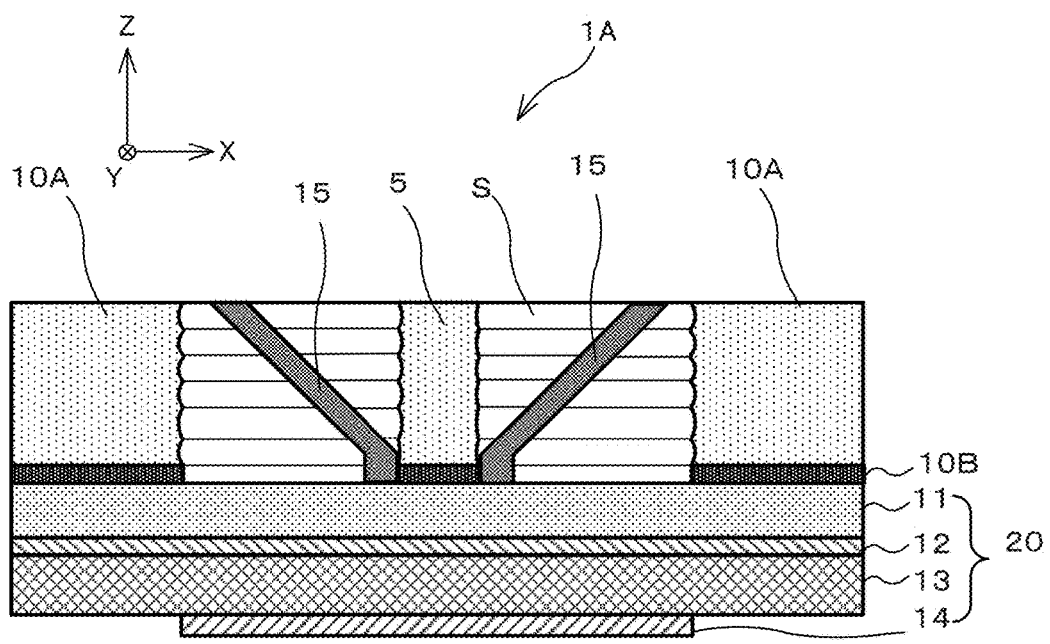
FIG. 6 is a cross-sectional view illustrating scallops provided on the speaker portion.

Note that the hole 4 in the substrate 2 is formed by deep etching, which is described later. As illustrated in FIG. 6, scallops S made of an indentation and a projection alternating in the thickness direction of the substrate 2 are formed on the inner circumferential wall of the hole 4. The scallops S are made of indentations and projections that are formed along the depth direction through repetitive etchings for the deep etching. The number of indentations and projections depends on the number of repetitive etchings, which is described later. Facing the scallops S formed on the inner circumferential wall of the hole 4, scallops S are also formed on the outer circumferential wall of the attachment portion 5.

Figure 7A:
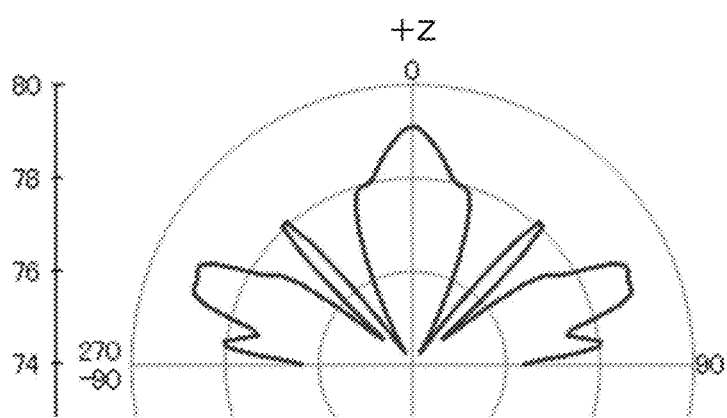
FIG. 7A is a directivity pattern diagram (part 1) illustrating directivity of the array speaker device.

As illustrated in FIG. 7A, the directivity pattern with voltage signals having a modulation frequency of 40 kHz shows a sharp peak extending in the +Z direction (0° direction). This indicates that the directivity has been increased. This is because the individual speakers are formed uniformly in shape, size, and orientation by using a semiconductor manufacturing technique.

Figure 7B:
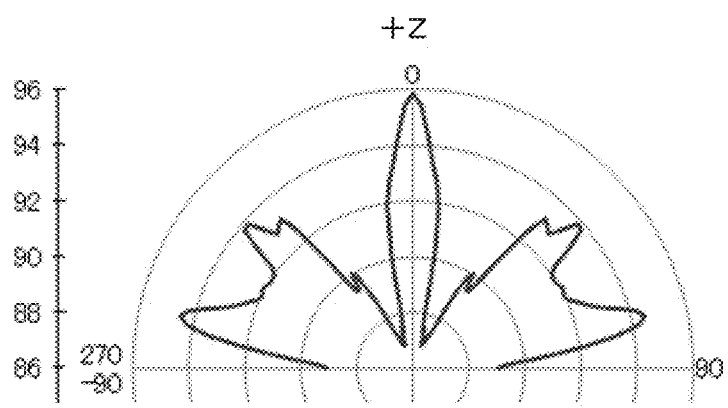
FIG. 7B is a directivity pattern diagram (part 2) illustrating directivity of the array speaker device.

As illustrated in FIG. 7B, the directivity pattern with voltage signals having a modulation frequency of 43.6 kHz shows a much sharper peak extending in the +Z direction. This indicates that the directivity has been further increased. This is probably because the resonant frequency of the overall array speaker device 1A is closer to 43.6 kHz.

A method for manufacturing the array speaker device 1A will now be described. As mentioned above, the array speaker device 1A is manufactured by using the MEMS technology.

Figure 8:
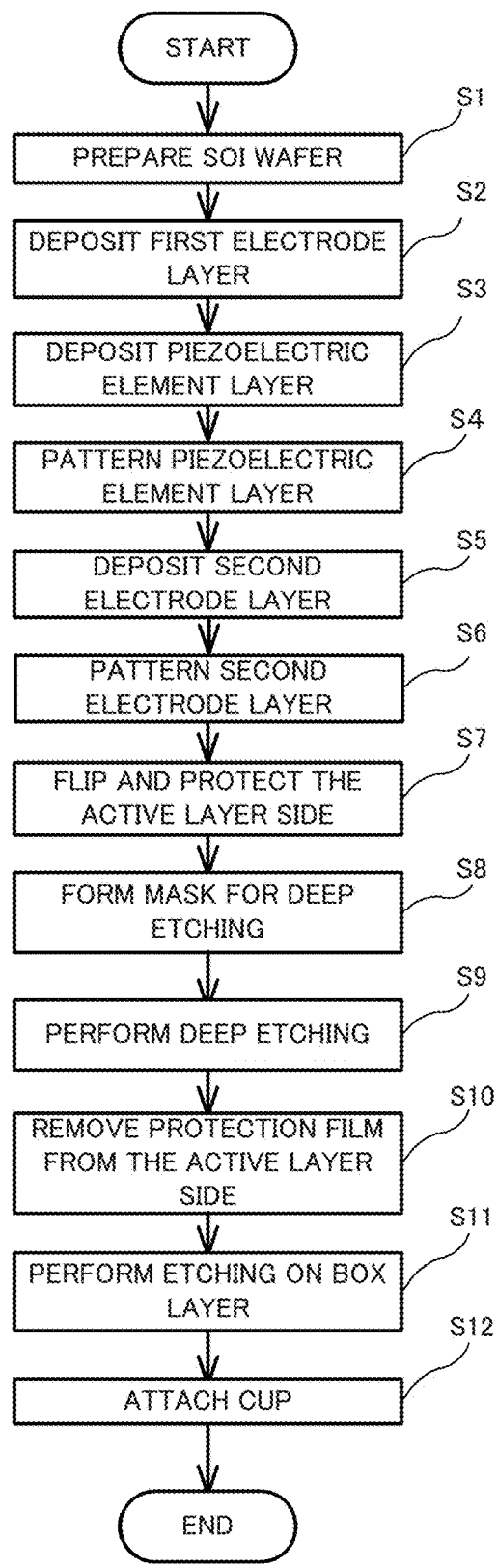
FIG. 8 is a flowchart showing steps of manufacturing an array speaker device.
Figure 9A:
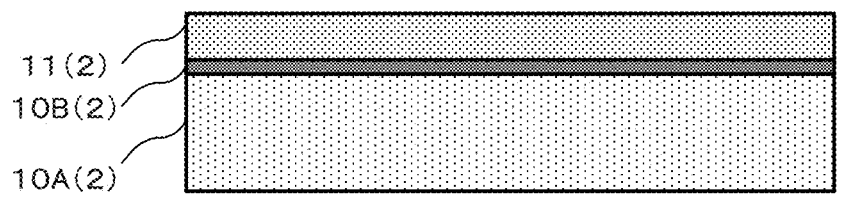
FIG. 9A is a cross-sectional view of an SOI wafer.

As shown in FIG. 8, manufacturing the array speaker device 1A starts with preparing an SOI wafer (step S1). As illustrated in FIG. 9A, the SOI substrate is a wafer containing an oxide film, and is a substrate having a layered structure made of a support substrate constituting a semiconductor substrate (to form the support layer 10A), a BOX layer constituting a buried oxide film on the support substrate (to form the BOX layer 10B), and a silicon (SOI) layer constituting a semiconductor layer on the BOX layer (the base material layer 11).

The SOI wafer is formed in the steps described below. First, ion implantation is used to bury oxygen molecules into a bulk silicon wafer having a uniform thickness from a surface of the silicon crystal, and then the silicon is oxidized at a high temperature to form an insulator film of oxide silicon in the silicon crystal. Next, the wafer and another raw bulk wafer having a uniform thickness are stacked and stuck together, and then the former wafer is peeled off to create an SOI wafer. The thickness of the peel is controlled by a distance from the surface of hydrogen ions that are implanted beforehand into a portion deeper than the oxide film. The peeled surface is subjected to chemical mechanical polishing (CMP) for surface finish. In this way, an SOI wafer is formed of portions corresponding to the support layer 10A, the BOX layer 10B, and the base material layer 11, each having a uniform thickness.

Figure 9B:
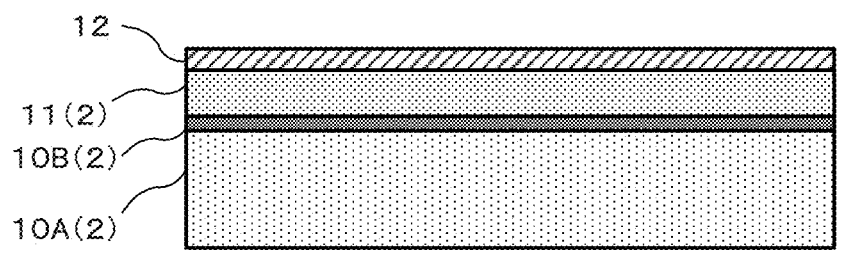
FIG. 9B illustrates the state in which a first electrode layer has been layered.

Next, the first electrode layer 12 is deposited on the active layer (base material layer 11) of the SOI wafer by, for example, using a sputtering method with a sputtering apparatus (step S2). FIG. 9B illustrates the state in which the first electrode layer 12 has been deposited on the base material layer 11.

Figure 9C:
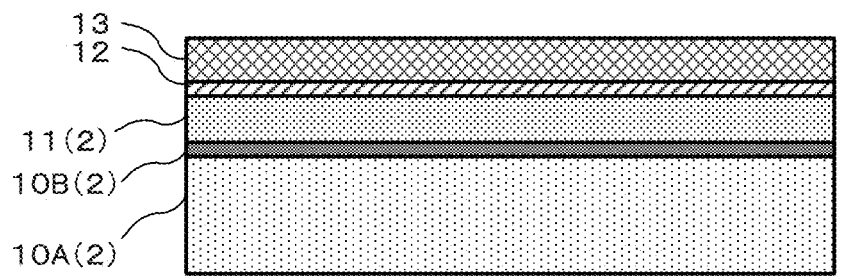
FIG. 9C illustrates the state in which a piezoelectric element layer has been layered.

Next, the piezoelectric element layer 13, which is a PZT film, is deposited by using, for example, a sputtering method with a sputtering apparatus (step S3). FIG. 9C illustrates the state in which the piezoelectric element layer 13 has been deposited on the first electrode layer 12.

Next, the piezoelectric element layer 13 is patterned by using photolithography (step S4). In this step, the piezoelectric element layer 13 is patterned so that four corners of the piezoelectric element layer 13 are removed through etching and the first electrode layer 12 is exposed at the removed portions.

Figure 10A:
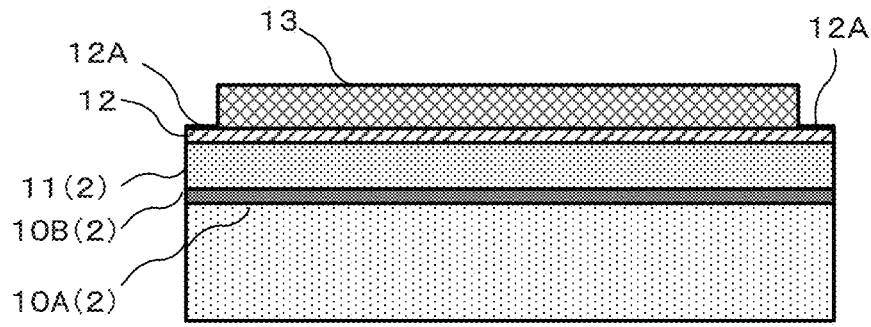
FIG. 10A illustrates the state in which the piezoelectric element layer has been patterned.

More specifically, the piezoelectric element layer 13 is coated with a photoresist by using, for example, a coater, and the pattern in the shape of the piezoelectric element layer 13 is transferred to the photoresist by using an exposure apparatus. The transferred pattern is developed by using, for example, a developer, and then etched with an etching apparatus. The patterning of the piezoelectric element layer 13 is now finished. As a result, external terminals 12A are formed at four corners of the first electrode layer 12, as illustrated in FIG. 10A.

Figure 10B:
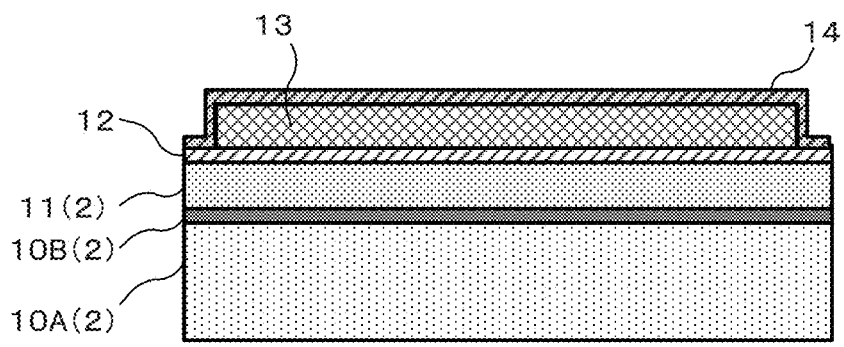
FIG. 10B illustrates the state in which a second electrode layer has been deposited.

Next, the second electrode layer 14 is deposited on the piezoelectric element layer 13 by using, for example, a sputtering method with a sputtering apparatus (step S5). As illustrated in FIG. 10B, the second electrode layer 14 is deposited on the piezoelectric element layer 13 and on part of the first electrode layer 12.

Next, the second electrode layer 14 is patterned by using photolithography (step S6). In this step, an outer region of the second electrode layer 14 is removed through etching, and then the second electrode layer 14 is patterned, so that the second electrode layer 14 is formed in a location corresponding to the vibrator 20.

Figure 10C:
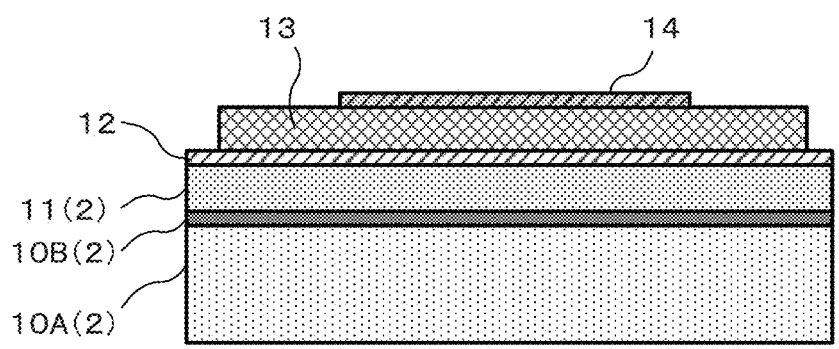
FIG. 10C illustrates the state in which the second electrode layer has been patterned.

More specifically, the second electrode layer 14 is coated with a photoresist by using, for example, a coater, and the pattern in the shape of the second electrode layer 14 is transferred to the photoresist by using an exposure apparatus. The transferred pattern is developed by using, for example, a developer, and then etched with an etching apparatus. Now, the patterning is finished and the second electrode layer 14 is formed. As a result, the second electrode layer 14 in a circular shape is formed as illustrated in FIG. 10C.

Figure 11A:
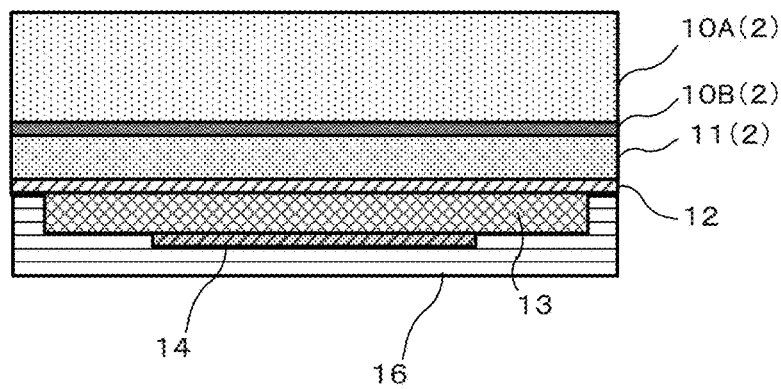
FIG. 11A illustrates the state in which the substrate has been flipped and its bottom face has been protected.

Next, the substrate 2 is flipped and protection is provided on the side of the active layer (base material layer 11) (step S7). In this step, as illustrated in FIG. 11A, a protection film 16 is formed on the lower side, namely on the first electrode layer 12, the piezoelectric element layer 13, and the second electrode layer 14.

Figure 11B:
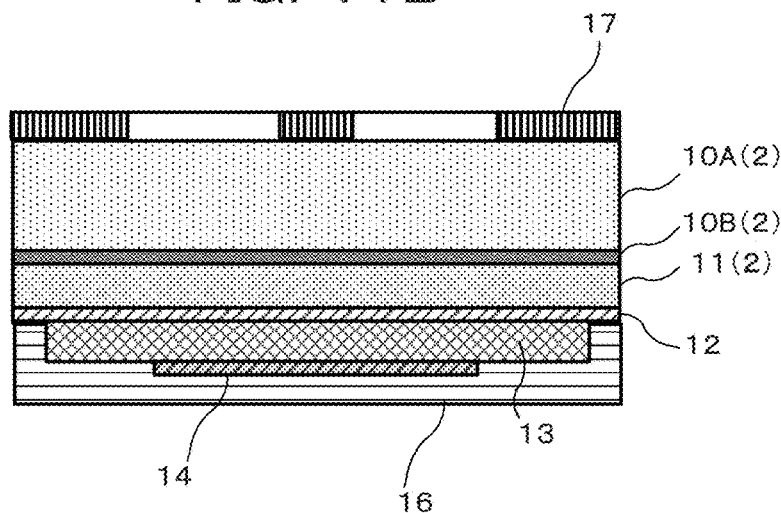
FIG. 11B illustrates the state in which masks for deep etching have been formed on the substrate.

Next, a mask 17 for deep etching is formed and mounted on the support layer 10A (step S8). Quartz (SiO2), for example, may be used for such mask 17. Consequently, as illustrated in FIG. 11B, the mask 17 is disposed on the support layer 10A so that a hole is made only around regions other than regions where the support layer 10A and the attachment portion 5 are to be formed.

Figure 11C:
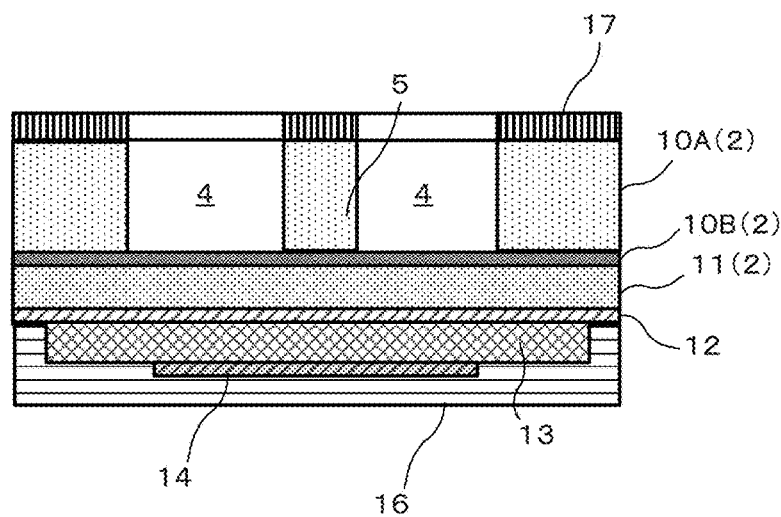
FIG. 11C illustrates the state in which deep etching has been carried out.

Next, deep etching is carried out in the support layer 10A (step S9). The deep etching may be called the Bosch process. The Bosch process repeats a cycle of isotropic etching, protection film formation (passivation), and anisotropic etching a plurality of times, with the result that both a deep (high aspect ratio) hole 4 and the attachment portion 5 are formed, as illustrated in FIG. 11C. During this process, scallops S are formed on the inner circumferential wall of the hole 4 and on the outer circumferential wall of the attachment portion 5.

An $SF_6$ gas, for example, is used for isotropic etching. F-based radicals generated from the $SF_6$ gas cause the portion not covered with the mask 17 (the portion corresponding to the hole 4) of the support layer 10A to be etched.

For forming a protection film, $C_4F_8$ plasma is used to be deposited as a protection film. As a result, a protection film is formed all over the support layer 10A including the hole 4.

During anisotropic etching, F-based reactive ions ($F^+$ ions) are fast hit against the bottom of the hole 4 to remove the protection film formed on the bottom of the isotropic etching.

Isotropic etching is again carried out on the portion where the protection film has been removed, making the hole 4 deeper. The deep etching is continued by repeating these steps. The deep etching is stopped when the etching bottom reaches the BOX layer 10B. Note that the pitch between scallops and the depth of an indentation and projection in the scallops S can be determined by, for example, adjusting reaction times in the individual steps.

Figure 12A:
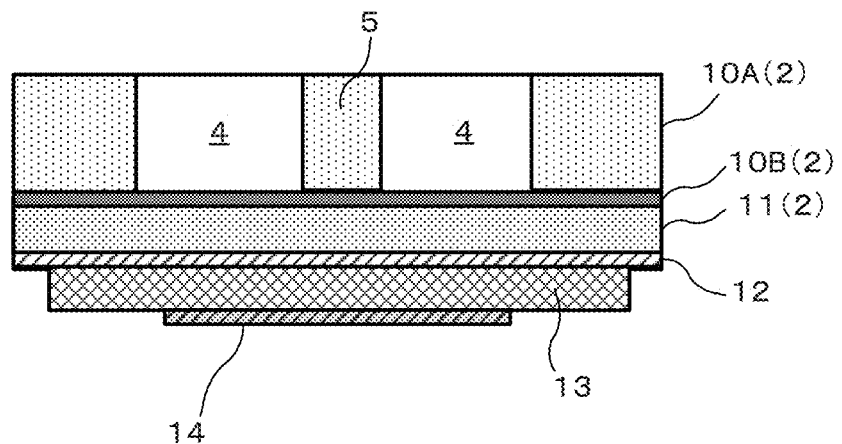
FIG. 12A illustrates the state in which the substrate has been etched.

Next, the protection film 16 covering on the side of the active layer (base material layer 11) is removed (step S10). This results in the cross section illustrated in FIG. 12A obtained around the speaker portion 3.

Figure 12B:
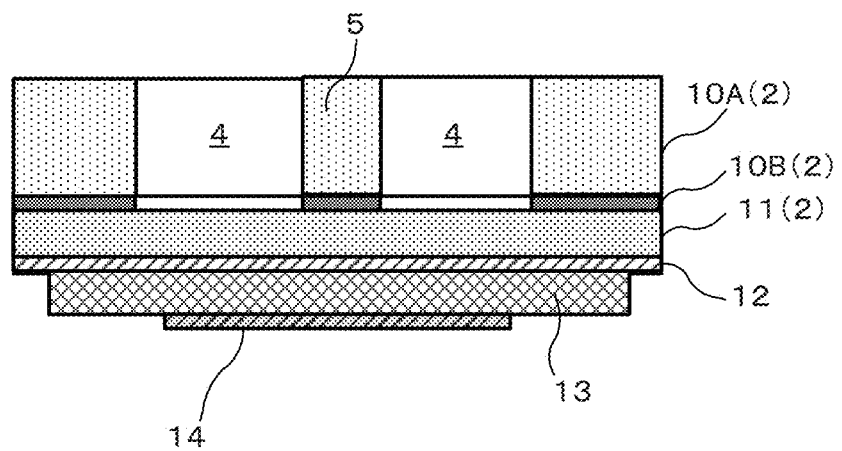
FIG. 12B illustrates the state in which the BOX layer has been etched.

Next, a portion of the BOX layer 10B corresponding to the bottom of the hole 4, which served as a stopper for the deep etching, is removed through etching with an etching apparatus (step S11). This results in the cross section illustrated in FIG. 12B obtained around the speaker portion 3.

Figure 12C:
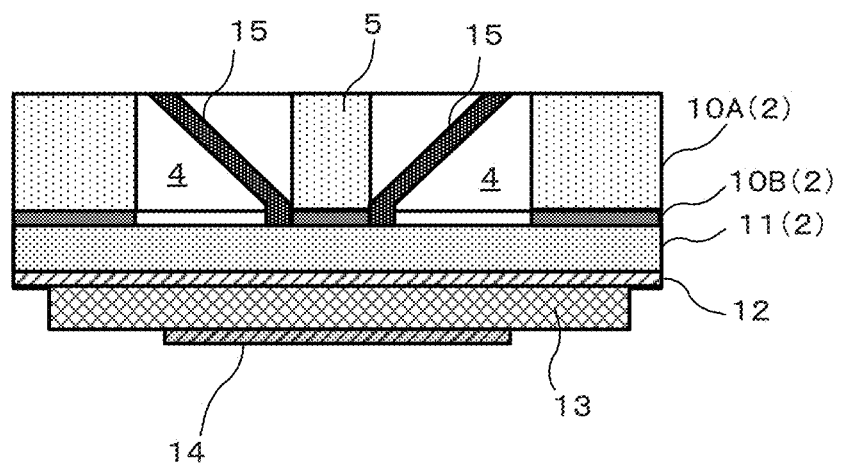
FIG. 12C illustrates the state in which a cup has been attached.

Next, the cup (resonator) 15 is attached to the attachment portion 5 with an adhesive (step S12). This results in the cross section illustrated in FIG. 12C obtained around the speaker portion 3. Subsequently, dicing is performed on the SOI wafer to be cut into a square. The array speaker device 1A is now almost completed.

As described above, the array speaker device 1A includes a plurality of speaker portions 3, each of which is formed by stacking layers each having a uniform thickness. As a result, the individual speaker portions 3 are almost identical in size, shape, and orientation. Therefore, upon receipt of inputted identical voltage signals, the individual speaker portions 3 generate and emit sound waves in the same direction. As a result, higher directivity can be achieved.

As described above, according to the present embodiment, the vibrator 20 and the hole 4 are formed on the substrate 2 by using a semiconductor manufacturing technique, the hole being intended for outputting a sound wave generated by vibration of the vibrator 20 in the thickness direction of the substrate 2. Hence, the speaker portions 3 each formed of the vibrator 20 and the hole 4 can be more uniform in shape, size, and orientation. As a result, higher directivity can be achieved by reducing variations in orientation and phase differences in sound waves outputted by the individual speaker portions 3.

In addition, the present embodiment enables the array speaker device 1A to be thinner. For example, the overall thickness can be as small as about 600 μm.

Embodiment 2

Figure 13:
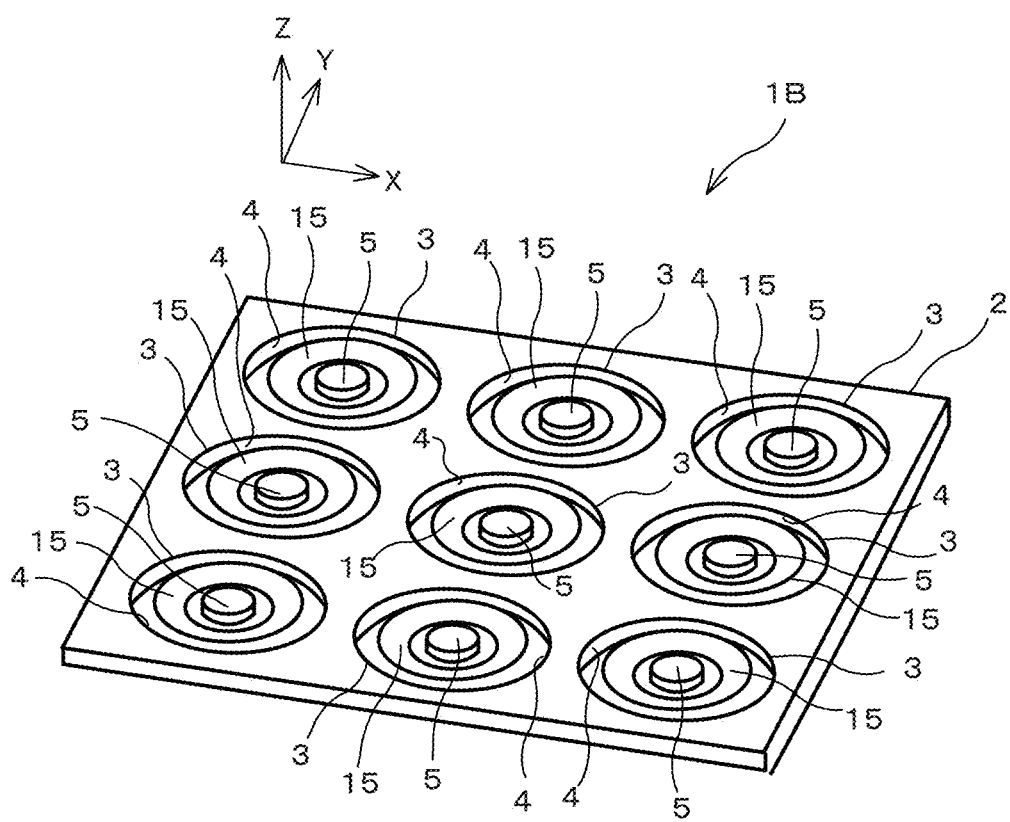
FIG. 13 is a perspective view of an array speaker device according to Embodiment 2 of the present disclosure.

The following describes Embodiment 2 of the present disclosure. As illustrated in FIG. 13, an array speaker device 1B according to Embodiment 2 includes nine speaker portions 3 (vibrators 20). The nine speaker portions 3 (vibrators 20) each are disposed at an intersection of lines forming a square grid. As with the foregoing embodiment, a cup 15 is attached to an attachment portion 5 in each speaker portion 3 in the present embodiment.

In the present embodiment, the speaker portions 3 are arranged at equal intervals in both the X and Y directions. Hence, sound waves generated by the array speaker device 1B are uniform along the thickness direction of the substrate 2, thus achieving higher directivity.

Figure 14A:
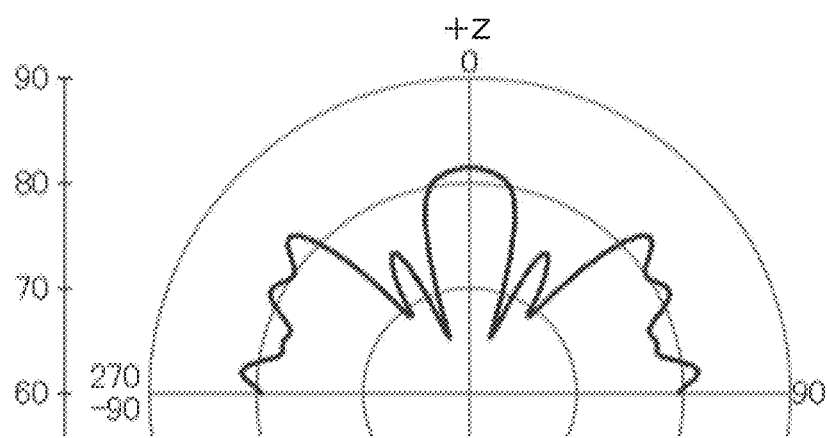
FIG. 14A is a directivity pattern diagram (part 1) illustrating directivity of the array speaker device in FIG. 13.
Figure 14B:
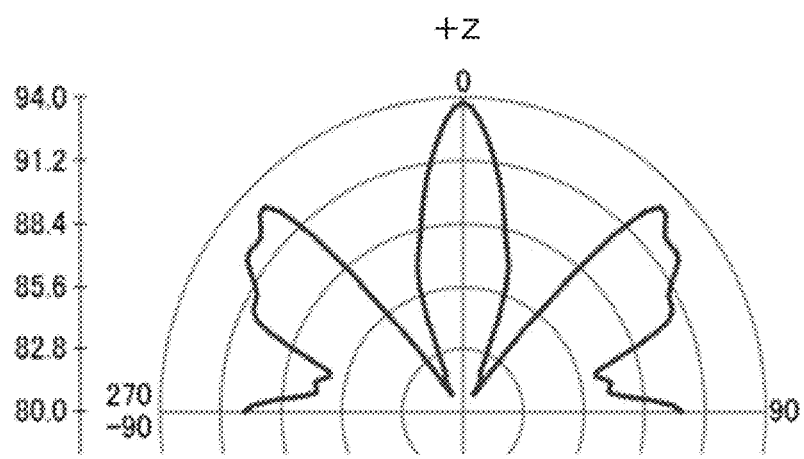
FIG. 14B is a directivity pattern diagram (part 2) illustrating directivity of the array speaker device in FIG. 13.

FIG. 14A shows a directivity pattern with voltage signals having a modulation frequency of 40 kHz, while FIG. 14B shows a directivity pattern with voltage signals having a modulation frequency of 43.6 kHz. As illustrated in FIGS. 14A and 14B, the array speaker device 1B according to the present embodiment also has a sharp peak in the +Z direction. The directivity pattern with a modulation frequency of 43.6 kHz, which is closer to the resonant frequency of the overall array speaker device 1B, shows a sharper peak in the +Z direction.

Embodiment 3

Figure 15:
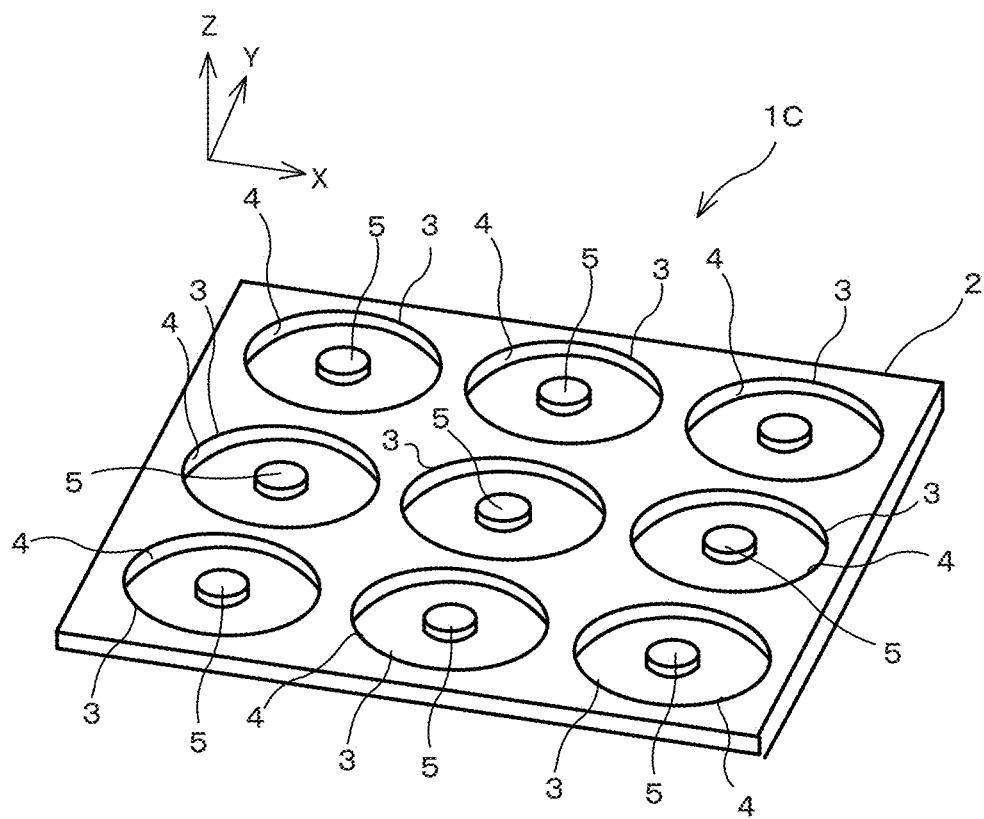
FIG. 15 is a perspective view of an array speaker device according to Embodiment 3 of the present disclosure.

The following describes Embodiment 3 of the present disclosure. As illustrated in FIG. 15, an array speaker device 1C according to Embodiment 3 includes nine speaker portions 3 (vibrators 20) like Embodiment 2, but each speaker portion 3 has no cup 15 attached thereto.

Figure 16A:
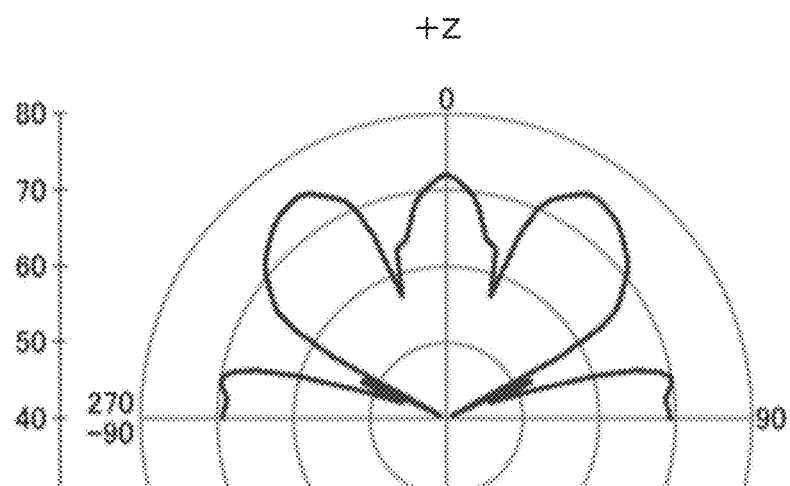
FIG. 16A is a directivity pattern diagram (part 1) illustrating directivity of the array speaker device in FIG. 15.
Figure 16B:
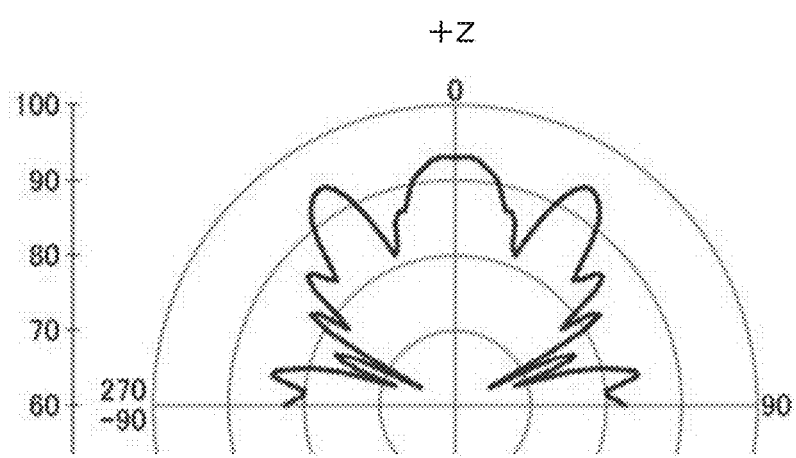
FIG. 16B is a directivity pattern diagram (part 2) illustrating directivity of the array speaker device in FIG. 15.

However, Embodiment 3 still achieves very sharp directivity in the thickness direction of the substrate 2, as shown in FIG. 16A (modulation frequency: 40 kHz) and FIG. 16B (modulation frequency: 45.4 kHz). The directivity pattern with a modulation frequency of 45.4 kHz, which is closer to the resonant frequency of the overall array speaker device 1C, shows a larger peak in the +Z direction.

Embodiment 4

Figure 17:
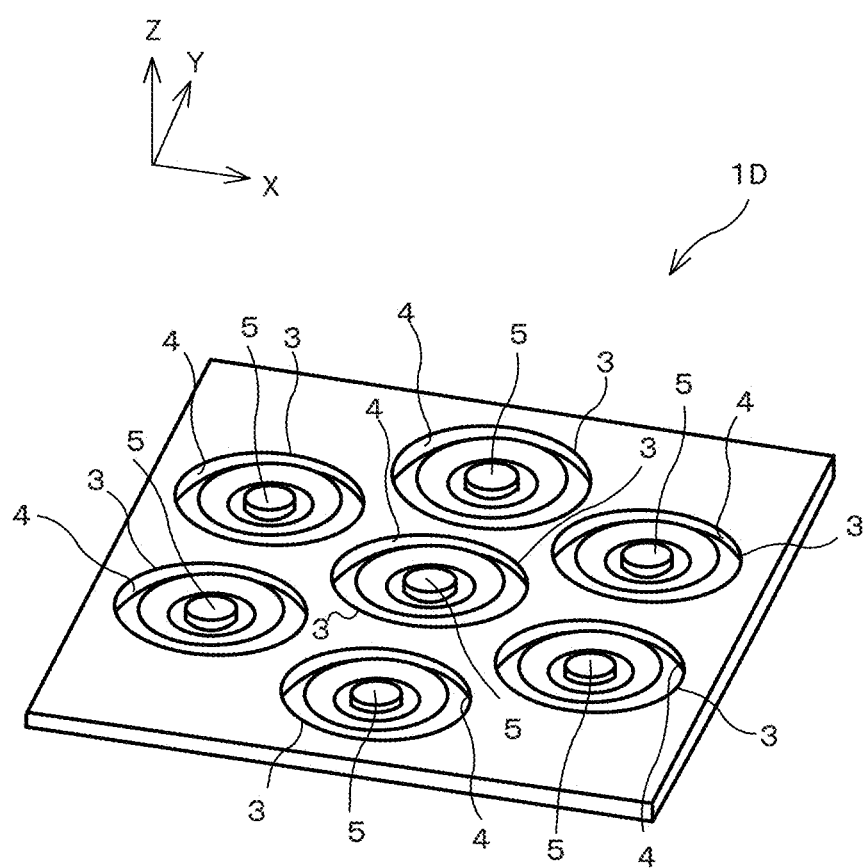
FIG. 17 is a perspective view of an array speaker device according to Embodiment 4 of the present disclosure.

The following describes Embodiment 4 of the present disclosure. As illustrated in FIG. 17, an array speaker device 1D according to Embodiment 4 includes seven speaker portions 3 (vibrators 20). One speaker portion 3 (vibrator 20) is disposed at the center of a circle, and the other speaker portions 3 (vibrators 20) are equally spaced on the circumference of the circle.

Figure 18A:
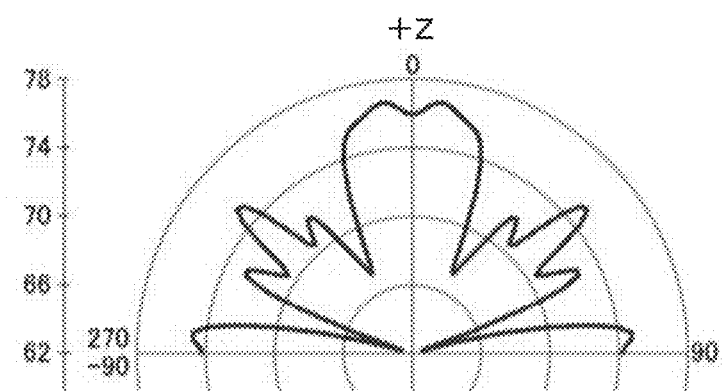
FIG. 18A is a directivity pattern diagram (part 1) illustrating directivity of the array speaker device in FIG. 17.
Figure 18B:
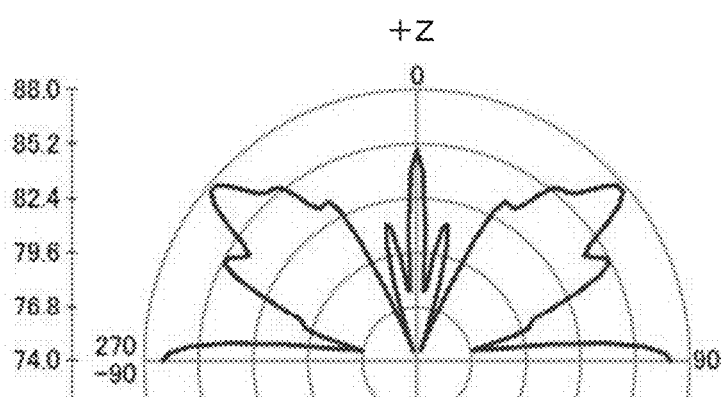
FIG. 18B is a directivity pattern diagram (part 2) illustrating directivity of the array speaker device in FIG. 17.

Embodiment 4 still achieves very sharp directivity of sound waves in the thickness direction of the substrate 2 (in the +Z direction), as shown in FIG. 18A (modulation frequency: 40 kHz) and FIG. 18B (modulation frequency: 37.6 kHz).

Embodiment 5

Figure 19:
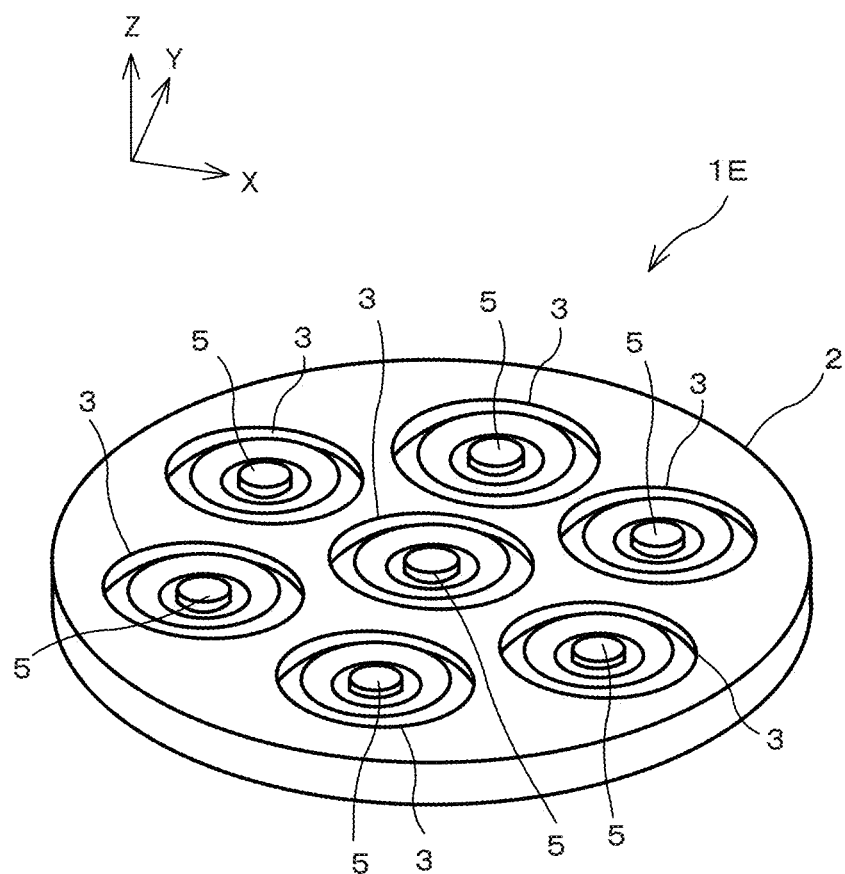
FIG. 19 is a perspective view of an array speaker device according to Embodiment 5 of the present disclosure.

The following describes Embodiment 5 of the present disclosure. As illustrated in FIG. 19, an array speaker device 1E according to Embodiment 5 includes a circular substrate 2. The present embodiment is the same as Embodiment 4 above in that one speaker portion 3 (vibrator 20) is disposed at the center of a circle, and the other speaker portions 3 (vibrators 20) are equally spaced on the circumference of the circle.

Figure 20A:
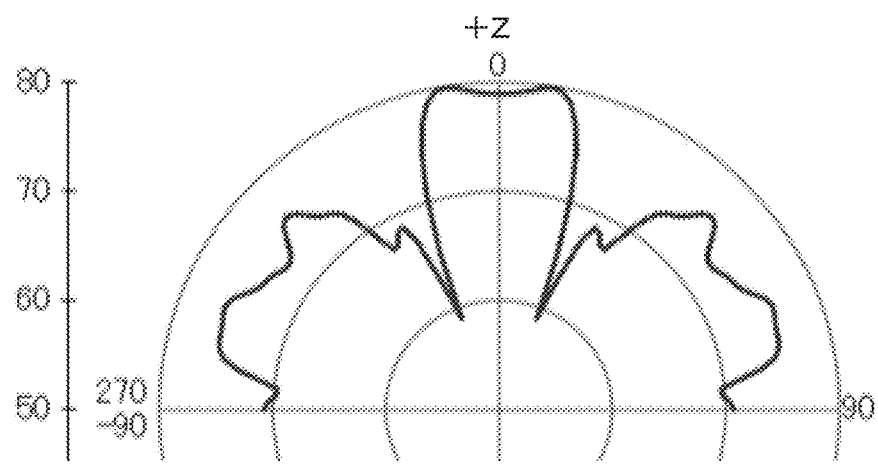
FIG. 20A is a directivity pattern diagram (part 1) illustrating directivity of the array speaker device in FIG. 19.
Figure 20B:
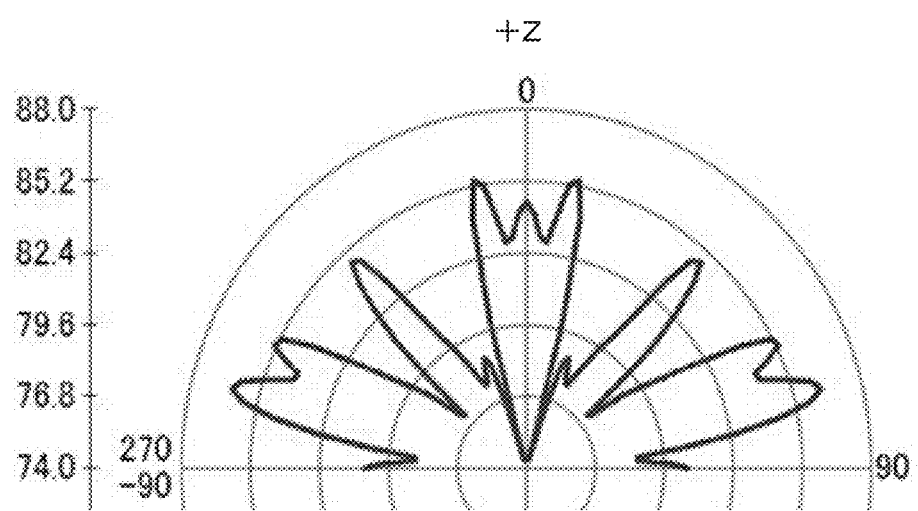
FIG. 20B is a directivity pattern diagram (part 2) illustrating directivity of the array speaker device in FIG. 19.

Embodiment 5 still achieves very sharp directivity in the thickness direction of the substrate 2, as shown in FIG. 20A (modulation frequency: 40 kHz) and FIG. 20B (modulation frequency: 38.2 kHz). The directivity pattern with a modulation frequency of 38.2 kHz, which is closer to the resonant frequency of the overall array speaker device 1E, shows sharper directivity.

Embodiment 6

Figure 21A:
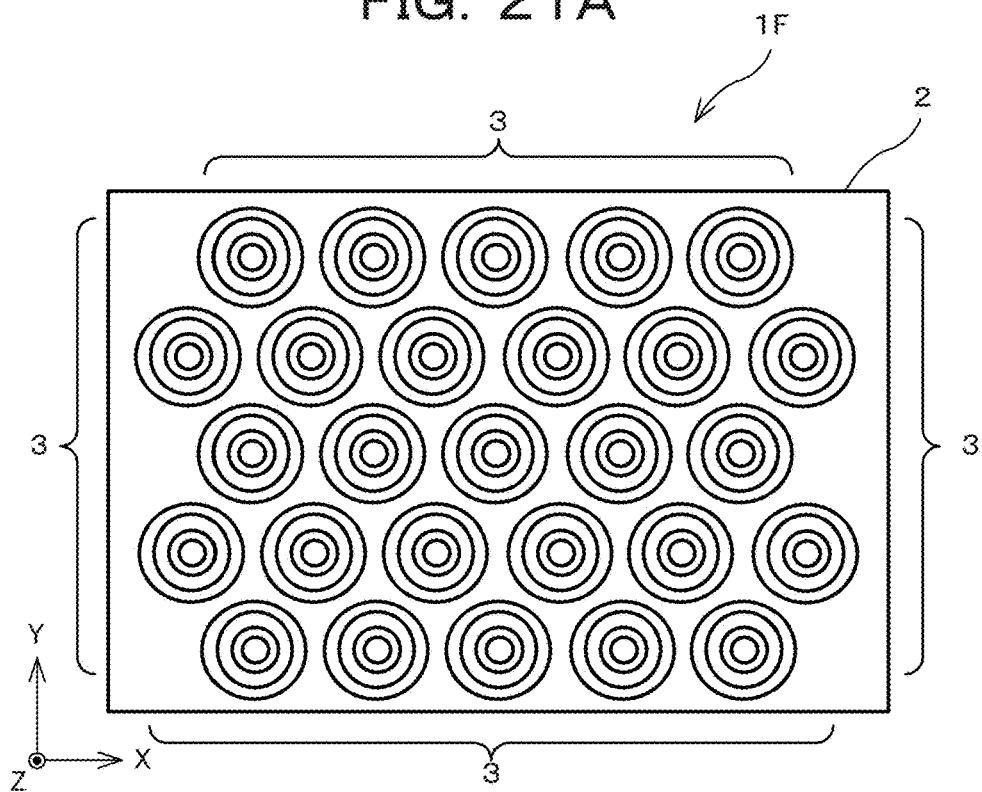
FIG. 21A is a top view of an array speaker device according to Embodiment 6 of the present disclosure.

The following describes Embodiment 6 of the present disclosure. As illustrated in FIG. 21A, an array speaker device 1F according to Embodiment 6 includes 27 speaker portions 3 (vibrators 20) arranged on the substrate 2. In the array speaker device 1F according to Embodiment 6, as illustrated in FIG. 21B, the speaker portions 3 (vibrators 20) are arranged so that three speaker portions 3 (vibrators 20) adjacent to one another are positioned at vertices of an equilateral triangle on the substrate 2.

Figure 21B:
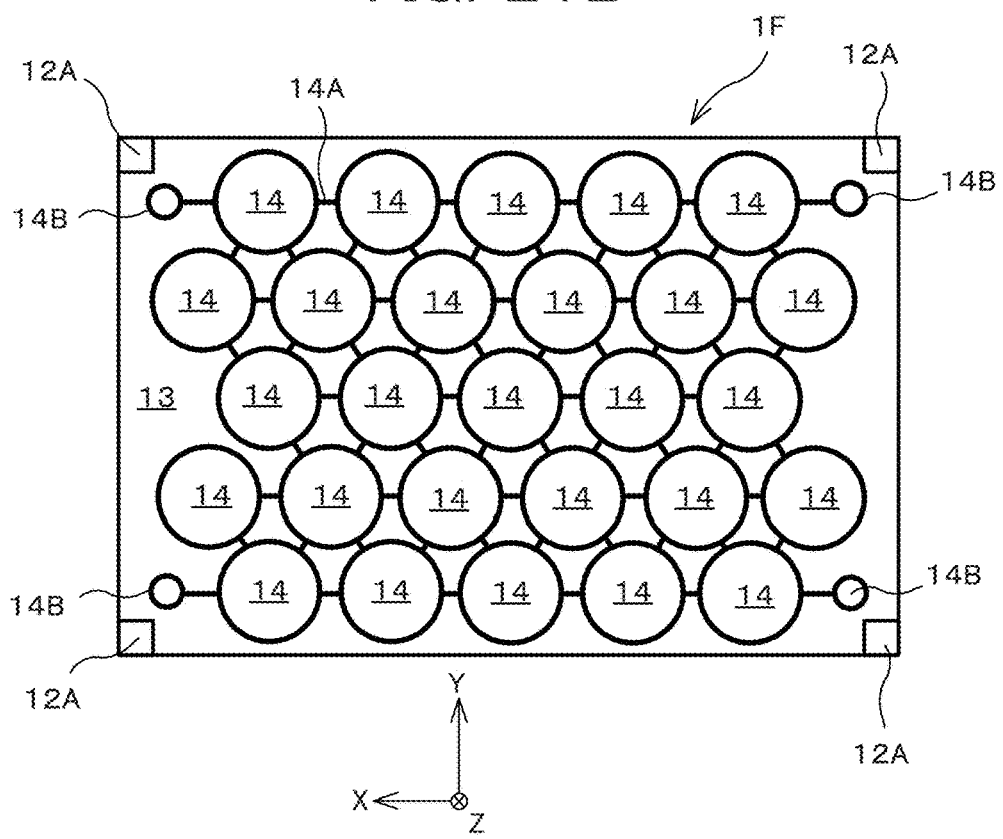
FIG. 21B is a bottom view of the array speaker device according to Embodiment 6 of the present disclosure.

As illustrated in FIG. 21B, on the bottom of the array speaker device 1F, each second electrode layer 14 in a circular shape is formed at a position corresponding to the vibrator 20 on the piezoelectric element layer 13, and a wiring pattern 14A is disposed to connect between second electrode layers 14. The wiring pattern 14A is connected to the external terminals 14B placed at four corners of the substrate 2. The signal modulator 31 in FIG. 4 is connected to the external terminal 14B, so that voltage signals are applied to the second electrode layers 14 via the external terminals 14B and the wiring pattern 14A.

As illustrated in FIG. 21B, speaker portions 3 (vibrators 20) adjacent to one another are equally spaced on an X-Y plane, thereby further increasing the directivity in the thickness direction of the substrate 2.

Figure 22A:
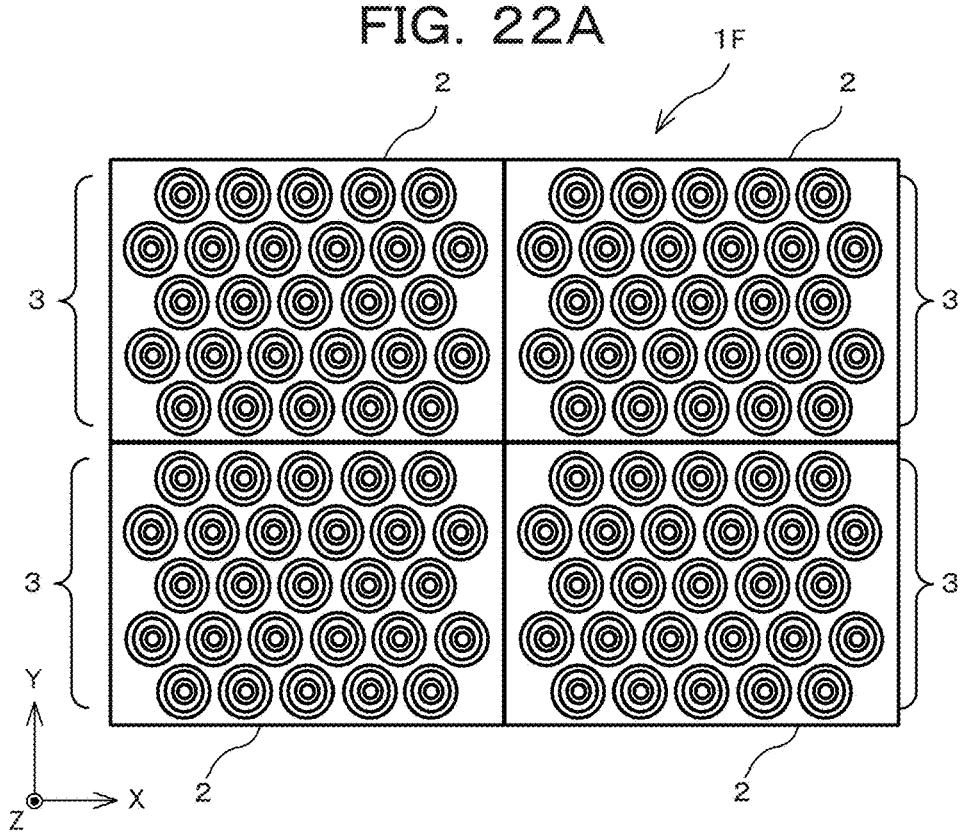
FIG. 22A is a top view of a plurality of the array speaker devices that are tiled, one of which is shown in FIG. 21A.
Figure 22B:
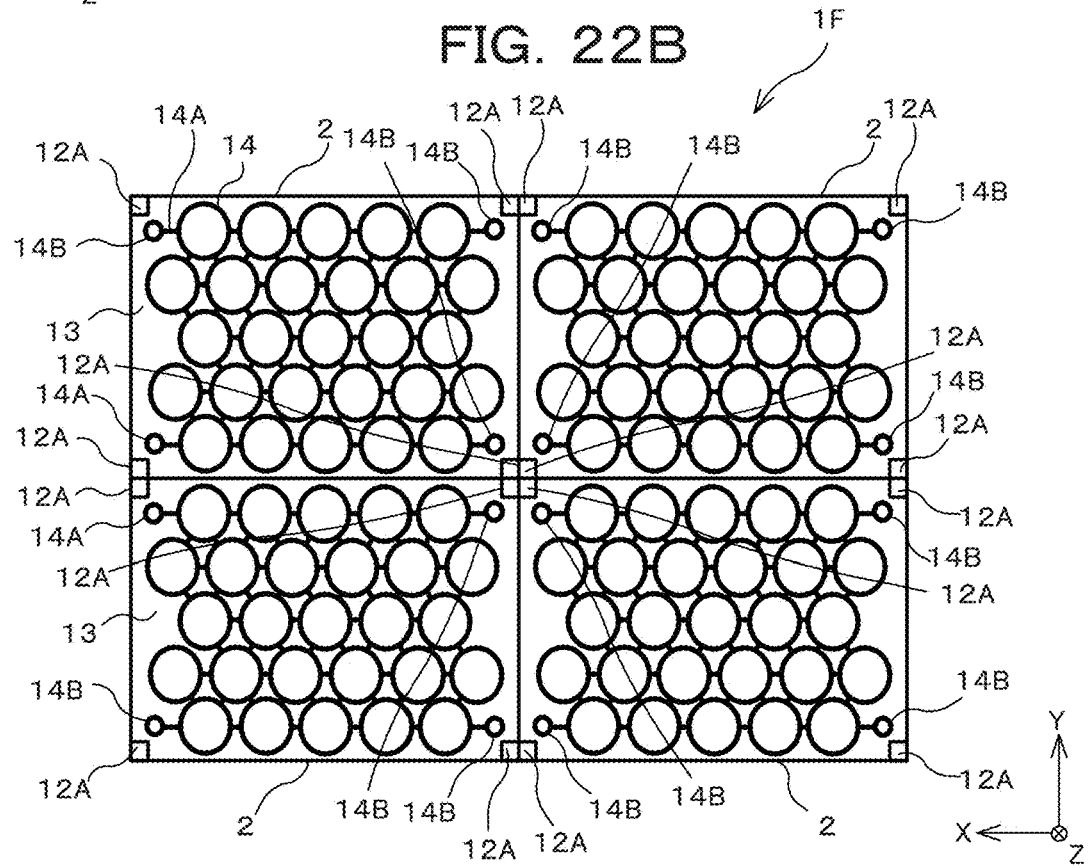
FIG. 22B is a bottom view of a plurality of the array speaker devices that are tiled, one of which is shown in FIG. 21B.

As illustrated in FIG. 22A, the array speaker device 1F allows a plurality of the substrates 2 to be tiled on an X-Y plane with the speaker portions 3 oriented in the same direction. In this way, an overall sound volume can be further increased. In this case, as illustrated in FIG. 22B, the external terminals 12A on one of the plurality of the tiled substrates 2 are provided at positions (four corners of the substrate 2) opposite to the external terminals 12A provided on another adjacent substrate 2.

Likewise, the external terminals 14B on one of the plurality of the tiled substrates 2 are provided at positions (four corners of the substrate 2) opposite to the external terminals 14B provided on another adjacent substrate 2. By electrically connecting these external terminals 12A and 14B between substrates 2 with, for example, a jumper line, a parallel circuit for piezoelectric element layers 13 can be built across these substrates 2. As a result, the circuit for transmitting voltage signals can be simplified.

Embodiment 7

Figure 23A:
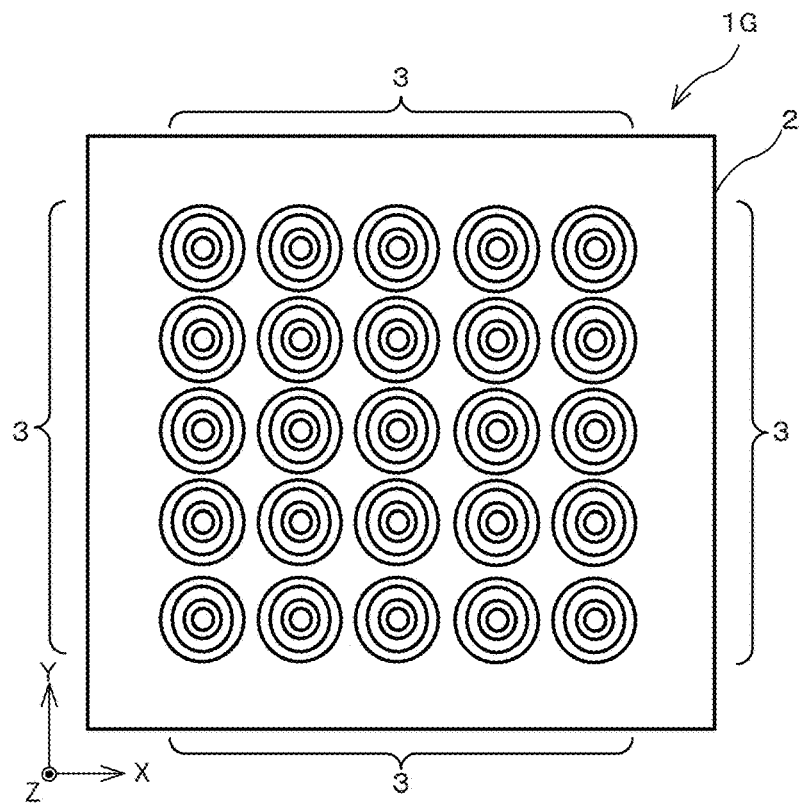
FIG. 23A is a top view of an array speaker device according to Embodiment 7 of the present disclosure.

The following describes Embodiment 7 of the present disclosure. As illustrated in FIG. 23A, an array speaker device 1G according to Embodiment 7 includes 25 speaker portions 3 arranged on the substrate 2. The speaker portions 3 each are disposed at an intersection of lines forming a square grid on the substrate 2.

Figure 23B:
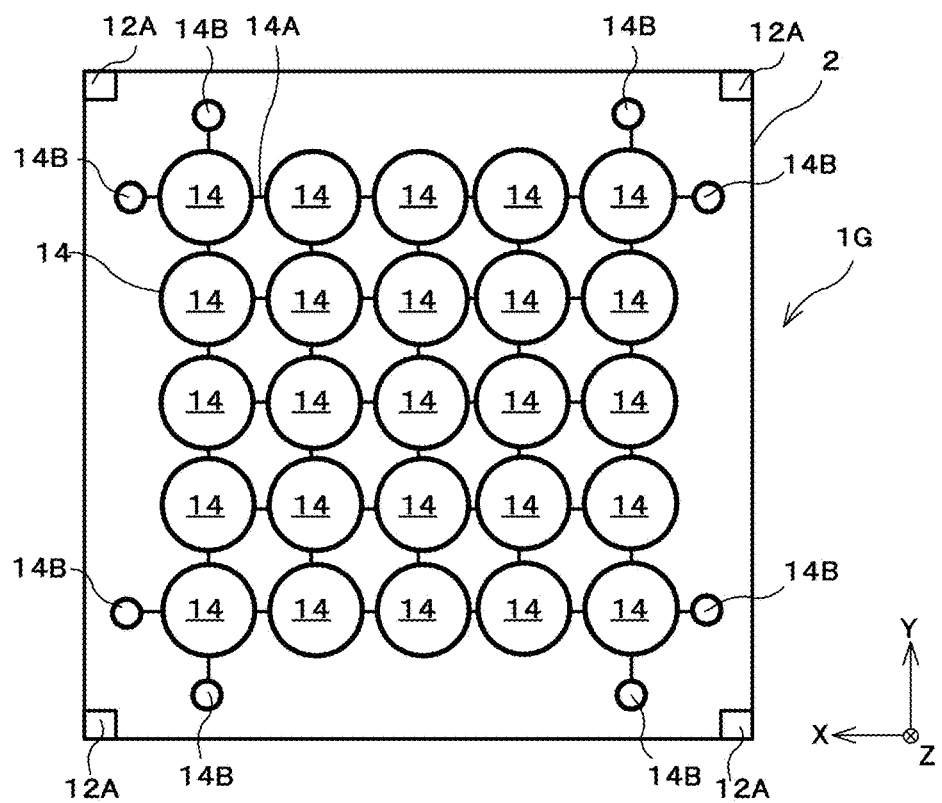
FIG. 23B is a bottom view of the array speaker device according to Embodiment 7 of the present disclosure.

As illustrated in FIG. 23B, on the −Z side of the array speaker device 1G, each second electrode layer 14 in a circular shape is formed at a position corresponding to the vibrator 20 on the piezoelectric element layer 13, and a wiring pattern 14A is disposed to connect between second electrode layers 14. The wiring pattern 14A is connected to the external terminals 14B. The signal modulator 31 in FIG. 4 is connected to the external terminals 14B, so that voltage signals are applied to the second electrode layers 14 via the external terminals 14B and the wiring pattern 14A.

On an X-Y plane, speaker portions 3 (vibrators 20) adjacent to each other are equally spaced in both the X and Y directions, thereby further increasing the directivity in the thickness direction of the substrate 2.

Figure 24A:
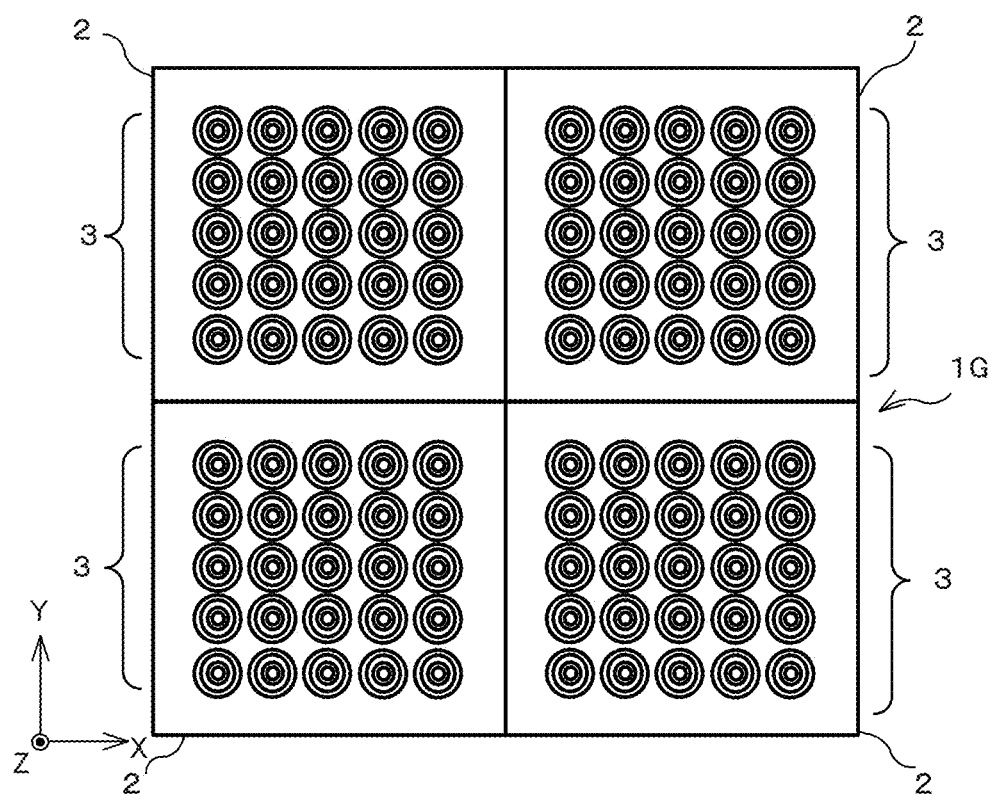
FIG. 24A is a top view of a plurality of the array speaker devices that are tiled, one of which is shown in FIG. 23A.
Figure 24B:
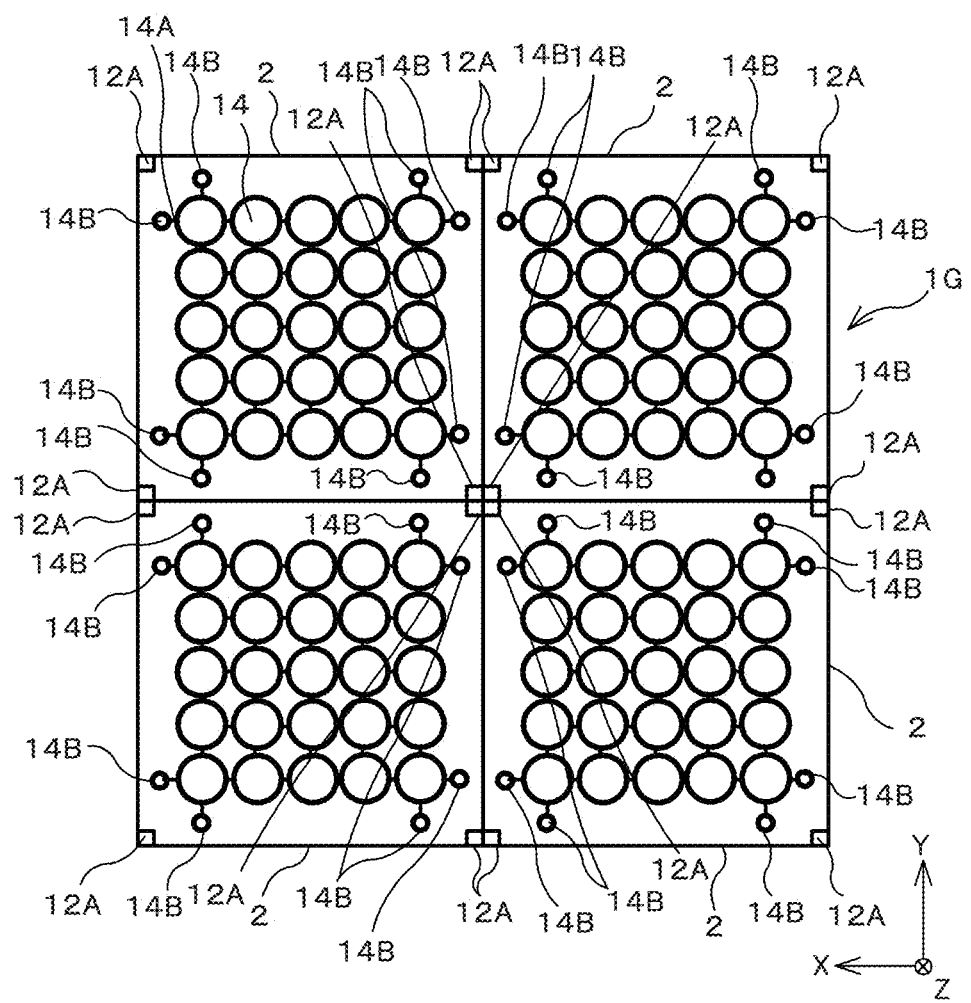
FIG. 24B is a bottom view of a plurality of the array speaker devices that are tiled, one of which is shown in FIG. 23B.

As illustrated in FIG. 24A, the array speaker device 1G allows a plurality of the substrates 2 to be tiled on an X-Y plane with the speaker portions 3 oriented in the same direction. In this way, an overall sound volume can be further increased. In this case, as illustrated in FIG. 24B, the external terminals 12A on one of the plurality of the tiled substrates 2 are provided at positions (four corners of the substrate 2) opposite to the external terminals 12A provided on another adjacent substrate 2.

Likewise, the external terminals 14B on one of the plurality of the tiled substrates 2 are provided at positions (four corners of the substrate 2) opposite to the external terminals 14B provided on another adjacent substrate 2. By connecting the external terminals 12A and 14B between adjacent substrates 2 with, for example, a jumper line, a parallel circuit for piezoelectric element layers 13 can be built across these substrates 2. As a result, the circuit for transmitting voltage signals can be simplified.

Embodiment 8

Figure 25A:
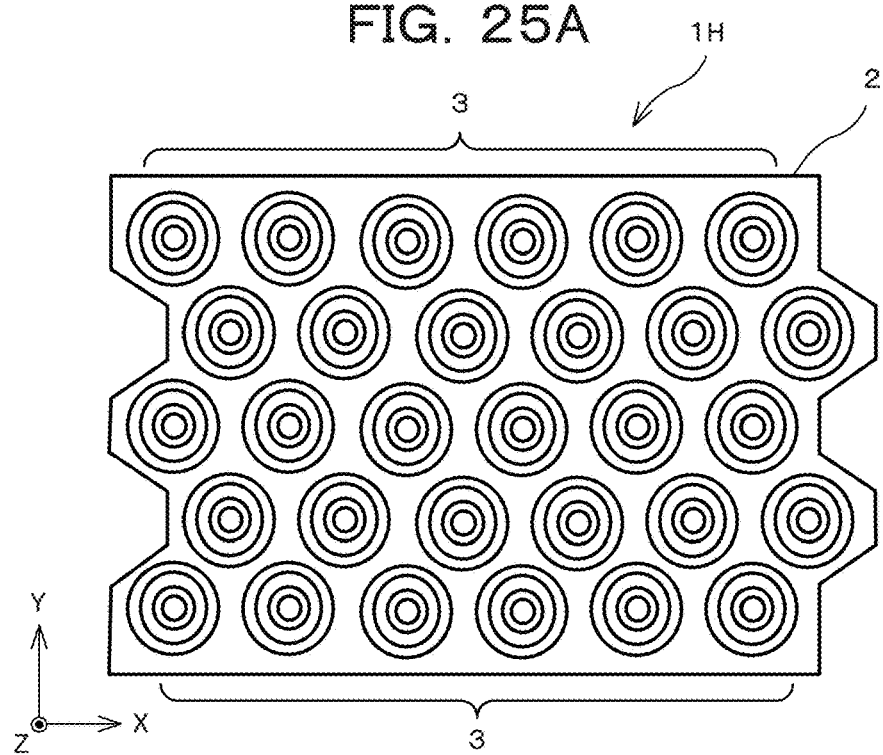
FIG. 25A is a top view of an array speaker device according to Embodiment 8 of the present disclosure.
Figure 25B:
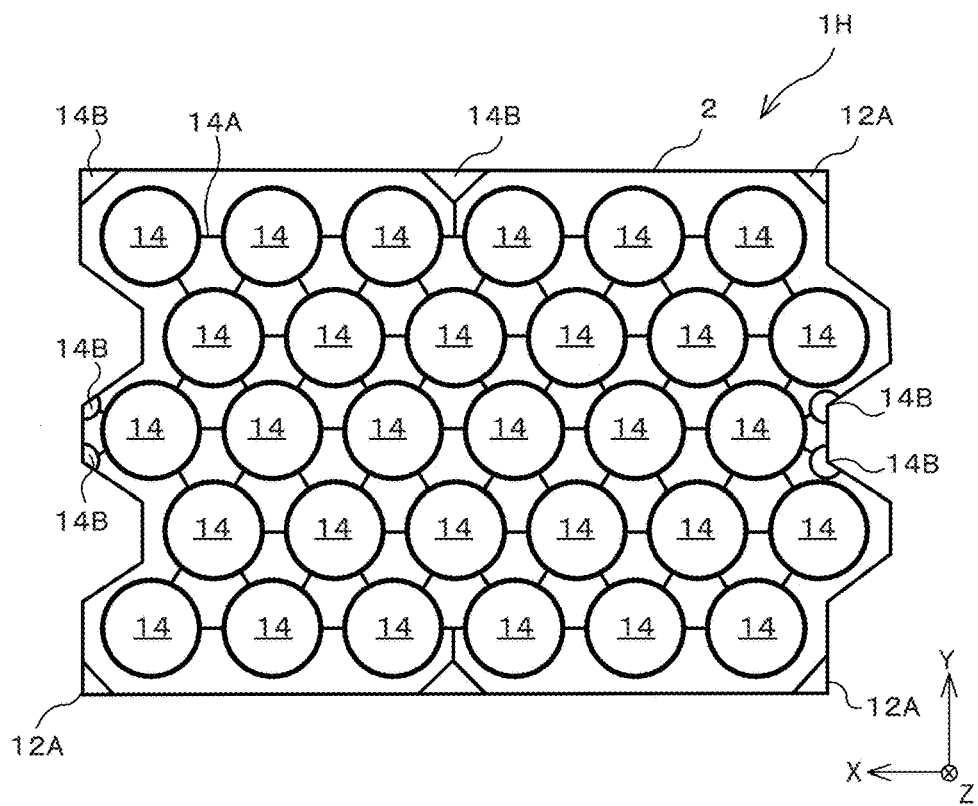
FIG. 25B is a bottom view of the array speaker device according to Embodiment 8 of the present disclosure.

The following describes Embodiment 8 of the present disclosure. As illustrated in FIGS. 25A and 25B, an array speaker device 1H according to Embodiment 8 includes 30 speaker portions 3 arranged. In the array speaker device 1H according to Embodiment 8, the speaker portions 3 (vibrators 20) are arranged so that three speaker portions 3 (vibrators 20) adjacent to one another are positioned at vertices of an equilateral triangle on the substrate 2.

Figure 26A:
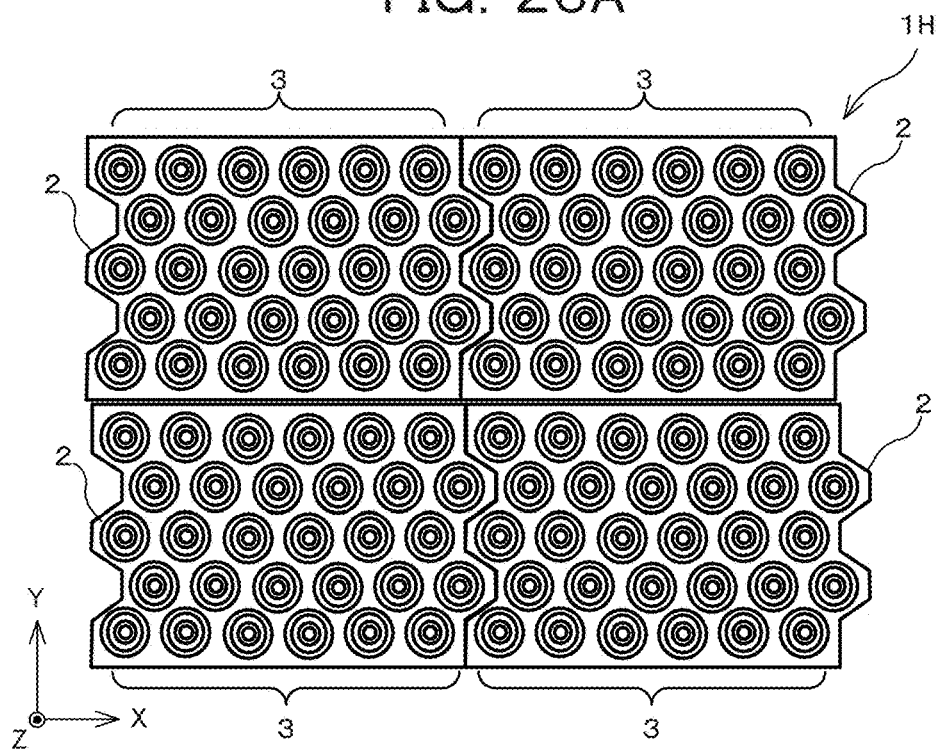
FIG. 26A is a top view of a plurality of the array speaker devices that are tiled, one of which is shown in FIG. 25A.

In the present embodiment, as illustrated in FIG. 26A, projections and indentations are provided on an outer edge of the substrate 2 to abut on an outer edge of another substrate 2 adjacent thereto so as to be engaged with projections and indentations on the outer edge of the other substrate 2 when a plurality of the substrates 2 is tiled. In the present embodiment, a speaker portion 3 (vibrator 20) is provided on a projection of an outer edge so that three speaker portions 3 (vibrators 20) adjacent to one another across two substrates 2 are positioned at vertices of an equilateral triangle congruent with an equilateral triangle formed of three speaker portions 3 (vibrators 20) adjacent to one another on a single substrate 2.

Figure 26B:
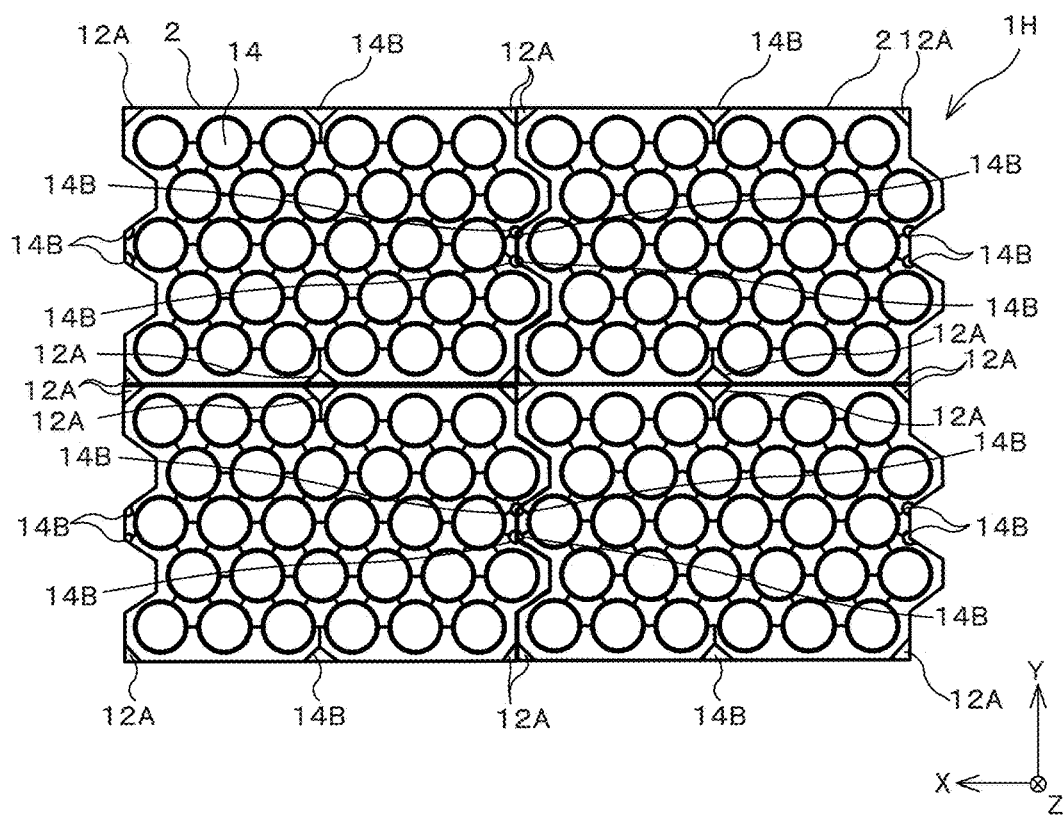
FIG. 26B is a bottom view of a plurality of the array speaker devices that are tiled, one of which is shown in FIG. 25B.

As illustrated in FIGS. 25B and 26B, the external terminals 12A on one of the plurality of the tiled substrates 2 are provided at positions (four corners) opposite to the external terminals 12A provided on another adjacent substrate 2. Likewise, the external terminals 14B on one of the plurality of the tiled substrates 2 are provided at positions (the midpoint of an outer edge of the substrate 2 and corners of a projection or indentation) opposite to the external terminals 14B provided on another adjacent substrate 2. By connecting the external terminals 14B between adjacent substrates 2 with, for example, a jumper line, a parallel circuit for piezoelectric element layers 13 can be built across these substrates 2. As a result, the circuit for transmitting voltage signals to a plurality of the array speaker devices 1H can be simplified.

In this way, speaker portions 3 (vibrators 20) are equally spaced across a plurality of adjacent substrates 2. As a result, both the sound volume and the directivity can be increased.

Embodiment 9

The following describes Embodiment 9 of the present disclosure. An array speaker device according to Embodiment 9 is characterized by a portion through which the apparatus is fastened to a fastening target. Examples of the fastening target include a base made of metal (such as aluminum or brass) or a resin.

Figure 27A:
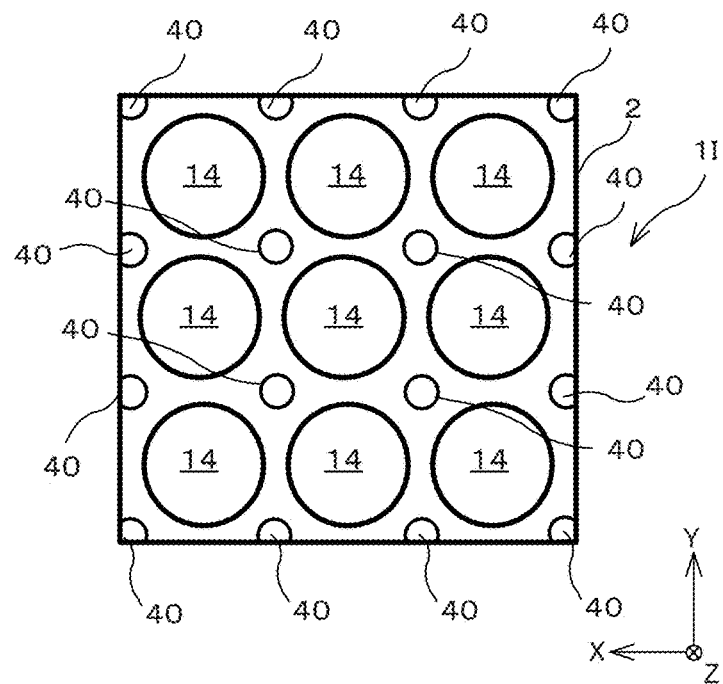
FIG. 27A illustrates a method (part 1) for fastening an array speaker device.

As illustrated in FIG. 27A, the array speaker device 1I according to Embodiment 9 includes a fastening portion 40 formed on part of the piezoelectric element layer 13 being exposed on the side of one face (−Z face) of the substrate 2. In the array speaker device 1I according to the present embodiment, each fastening portion 40 is disposed at an intersection of lines forming a two-dimensional grid that is formed to circumvent the second electrode layer 14. Each fastening portion 40 is in a circular shape. The array speaker device 1I is fastened to the fastening target with an adhesive or screw through each fastening portion 40.

Figure 27B:
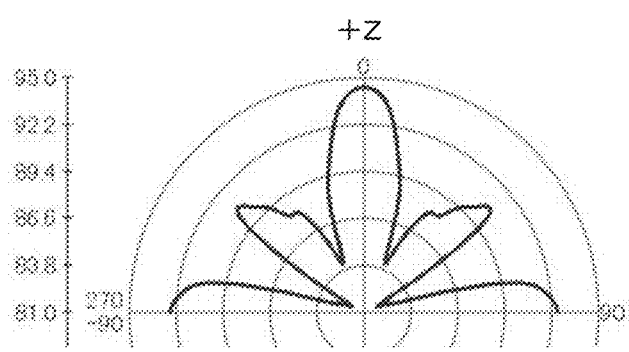
FIG. 27B is a directivity pattern diagram (part 1) illustrating directivity of the array speaker device in FIG. 27A.
Figure 27C:
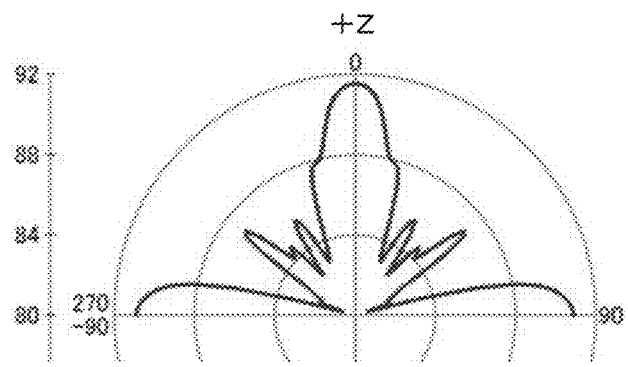
FIG. 27C is a directivity pattern diagram (part 2) illustrating directivity of the array speaker device in FIG. 27A.

FIG. 27B shows the directivity pattern with voltage signals having a modulation frequency of 40 kHz. FIG. 27C shows the directivity pattern with voltage signals having a modulation frequency of 39.6 kHz, which is the resonant frequency of the overall array speaker device 1I. FIGS. 27B and 27C each show very sharp directivity of sounds in the +Z direction.

Embodiment 10

The following describes Embodiment 10 of the present disclosure. An array speaker device according to Embodiment 10 is characterized by a portion through which the apparatus is fastened to a fastening target.

Figure 28A:
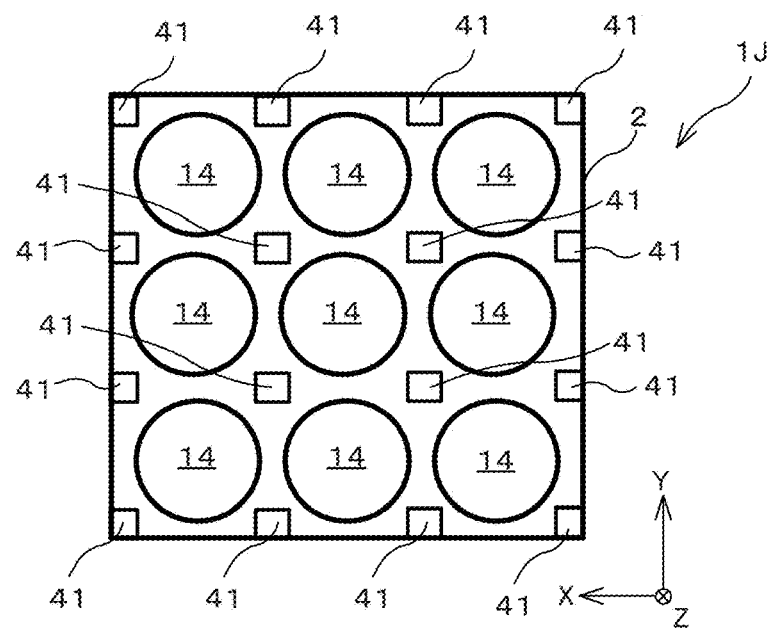
FIG. 28A illustrates a method (part 2) for fastening an array speaker device.

As illustrated in FIG. 28A, the array speaker device 1J according to Embodiment 10 includes a fastening portion 41 formed on part of the piezoelectric element layer 13 being exposed on the side of one face (−Z face) of the substrate 2. In the array speaker device 1J according to the present embodiment, each fastening portion 41 is disposed at an intersection of lines forming a two-dimensional grid that is formed to circumvent the second electrode layer 14. Each fastening portion 41 is in a rectangular shape. The array speaker device 1J is stuck and fastened to the fastening target with an adhesive or the like through each fastening portion 41.

Figure 28B:
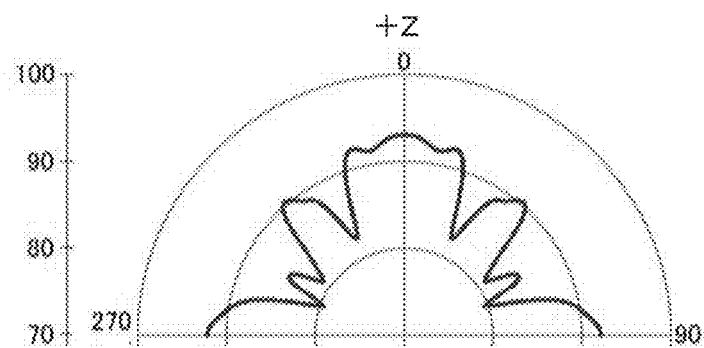
FIG. 28B is a directivity pattern diagram (part 1) illustrating directivity of the array speaker device in FIG. 28A.
Figure 28C:
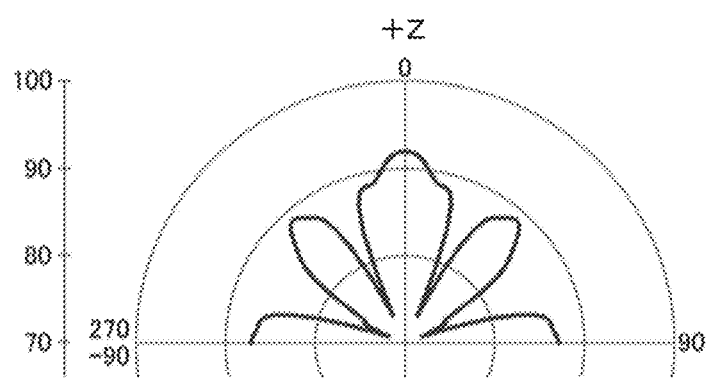
FIG. 28C is a directivity pattern diagram (part 2) illustrating directivity of the array speaker device in FIG. 28A.

FIG. 28B shows the directivity pattern with voltage signals having a modulation frequency of 40 kHz. FIG. 28C shows the directivity pattern with voltage signals having a modulation frequency of 39.6 kHz, which is the resonant frequency of the overall array speaker device 1J. FIGS. 28B and 28C each show very sharp directivity of sounds in the +Z direction. The directivity shown in FIG. 28C, which represents a modulation frequency of 39.6 kHz, has a slightly sharper peak.

Embodiment 11

The following describes Embodiment 11 of the present disclosure. An array speaker device according to the present embodiment is characterized by a portion through which the apparatus is fastened to a fastening target.

Figure 29A:
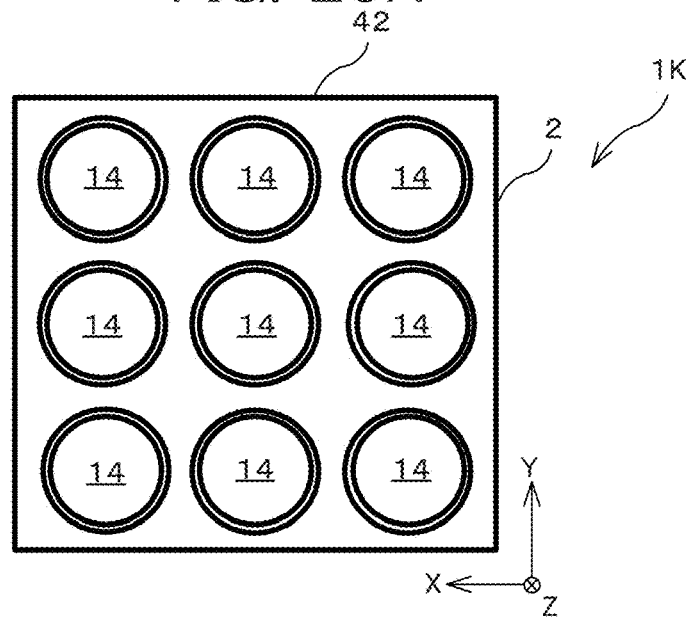
FIG. 29A illustrates a method (part 3) for fastening an array speaker device.

As illustrated in FIG. 29A, the array speaker device 1K according to the present embodiment includes a fastening portion 42 formed on part of the piezoelectric element layer 13 being exposed on the side of one face of the substrate 2. The fastening portion 42 entirely covers the piezoelectric element layer 13 that is formed to circumvent the second electrode layer 14. Some margin is provided between the fastening portion 42 and each second electrode layer 14.

Figure 29B:
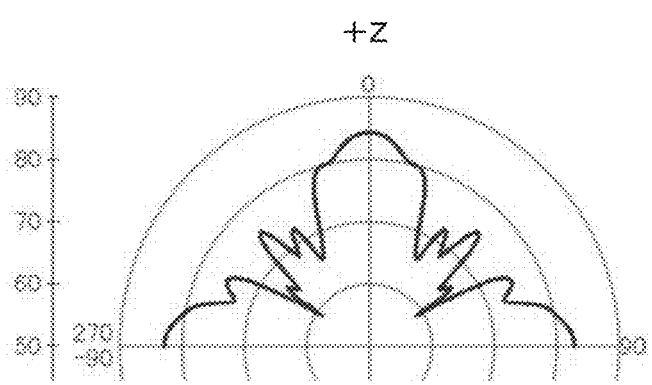
FIG. 29B is a directivity pattern diagram (part 1) illustrating directivity of the array speaker device in FIG. 29A.
Figure 29C:
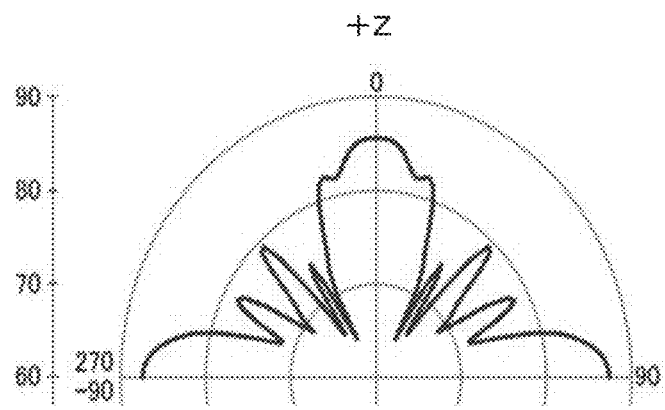
FIG. 29C is a directivity pattern diagram (part 2) illustrating directivity of the array speaker device in FIG. 29A.

FIG. 29B shows the directivity pattern with voltage signals having a modulation frequency of 40 kHz. FIG. 29C shows the directivity pattern with voltage signals having a modulation frequency of 39.6 kHz, which is the resonant frequency of the overall array speaker device 1K. FIGS. 29B and 29C each show very sharp directivity of sounds in the +Z direction. The directivity representing a modulation frequency of 39.6 kHz has a slightly sharper peak.

Embodiment 12

The following describes Embodiment 12 of the present disclosure. An array speaker device according to Embodiment 12 is characterized by a portion through which the apparatus is fastened to a fastening target.

Figure 30A:
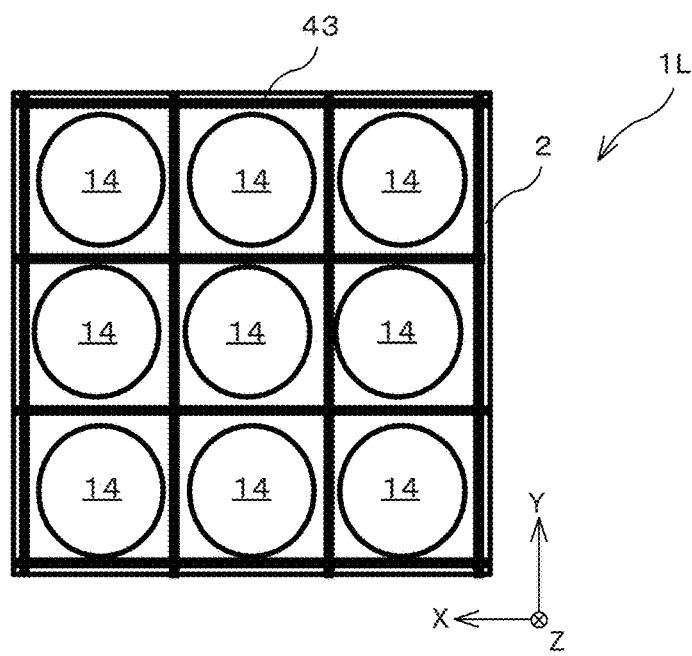
FIG. 30A illustrates a method (part 4) for fastening an array speaker device.

As illustrated in FIG. 30A, the array speaker device 1L according to the present embodiment includes a fastening portion 43 which is formed on part of the piezoelectric element layer 13 being exposed on the side of one face (−Z face) of the substrate 2 and which is stuck and fastened to a fastening target. The fastening portion 43 constitutes a square grid formed to circumvent the second electrode layer 14.

Figure 30B:
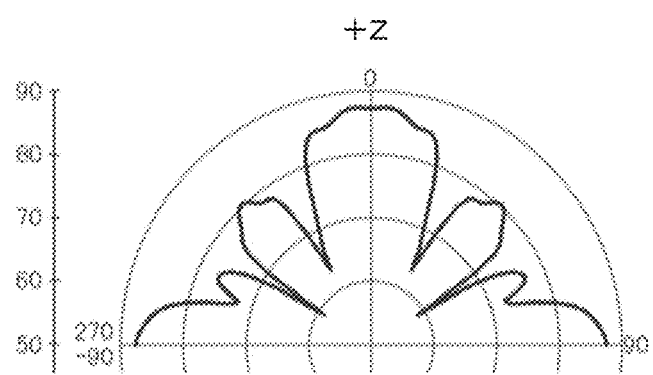
FIG. 30B is a directivity pattern diagram (part 1) illustrating directivity of the array speaker device in FIG. 30A.
Figure 30C:
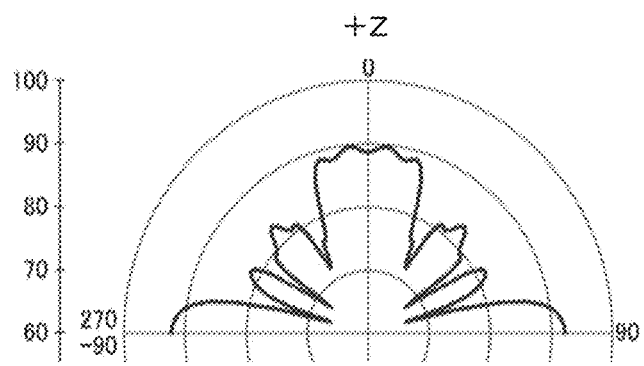
FIG. 30C is a directivity pattern diagram (part 2) illustrating directivity of the array speaker device in FIG. 30A.

FIG. 30B shows the directivity pattern with sound signals having a modulation frequency of 40 kHz. FIG. 30C shows the directivity pattern with sound signals having a modulation frequency of 37 kHz, which is the resonant frequency of the overall array speaker device 1L. FIGS. 30B and 30C each show very sharp directivity of sounds in the +Z direction. The directivity representing a modulation frequency of 37 kHz has a sharper peak.

Embodiment 13

The following describes Embodiment 13 of the present disclosure. An array speaker device according to Embodiment 13 is characterized by a portion through which the apparatus is fastened to a fastening target.

Figure 31A:
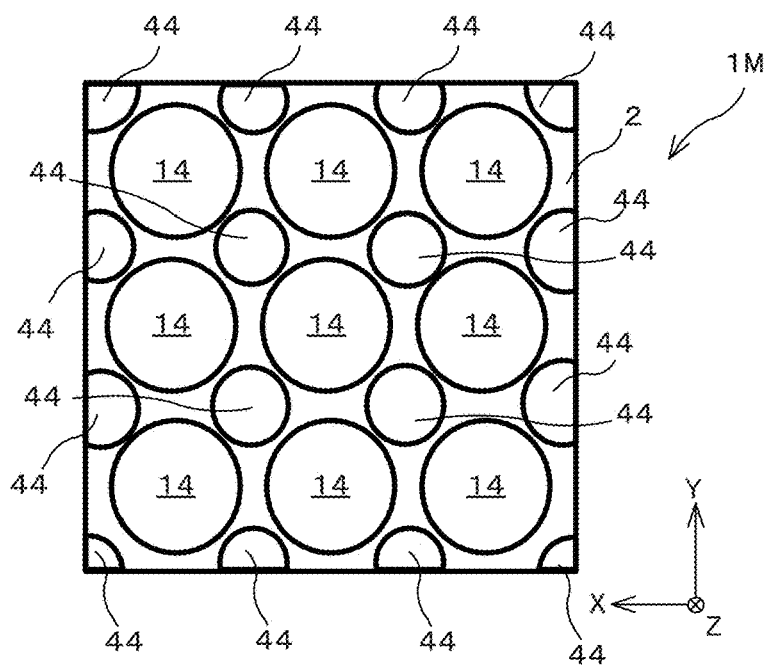
FIG. 31A illustrates a method (part 5) for fastening an array speaker device.

As illustrated in FIG. 31A, the array speaker device 1M according to the present embodiment includes a fastening portion 44 formed on part of the piezoelectric element layer 13 being exposed on the side of one face of the substrate 2. The fastening portion 44 is stuck and fastened to a fastening target. Each fastening portion 44, which is in a circular shape, is formed at an intersection of lines forming a square grid formed to circumvent the second electrode layer 14. The fastening portion 44 is made as large as possible in size so that a minimum gap (margin) is provided between the fastening portion 44 and the second electrode layer 14.

Figure 31B:
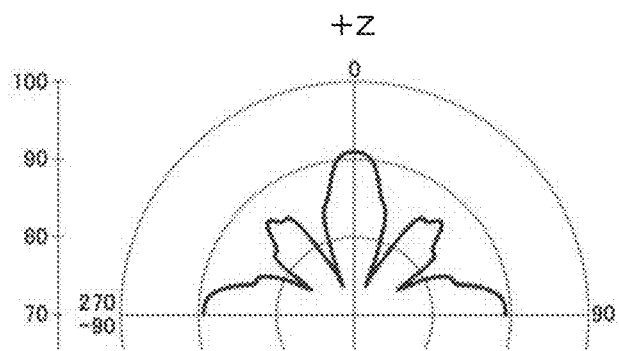
FIG. 31B is a directivity pattern diagram (part 1) illustrating directivity of the array speaker device in FIG. 31A.
Figure 31C:
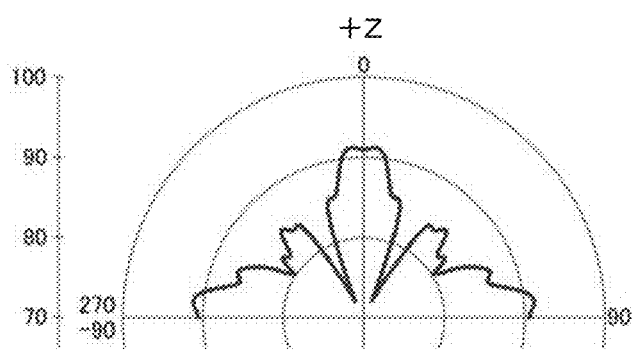
FIG. 31C is a directivity pattern diagram (part 2) illustrating directivity of the array speaker device in FIG. 31A.

FIG. 31B shows the directivity pattern with voltage signals having a modulation frequency of 40 kHz. FIG. 31C shows the directivity pattern with voltage signals having a modulation frequency of 40.6 kHz, which is the resonant frequency of the overall array speaker device 1M. FIGS. 31B and 31C each show very sharp directivity of sounds in the +Z direction.

As a result of a comparison made among the directivity patterns of the array speaker devices 1I to 1M involving different fastening methods, it was found that the highest directivity of output sounds is achieved by using the fastening portions 40 in the array speaker device 1I according to Embodiment 9 described above to fasten the apparatus to a fastening target.

Specific processing methods used in individual steps of a method for manufacturing the array speaker device according to any of the forgoing embodiments, including, for example, methods for depositing a layer, patterning, and etching, may be changed as appropriate. For example, any method suitable for the specific material to be deposited on a semiconductor wafer may be used.

Materials and sizes of the foregoing array speaker devices 1A to 1M are not restrictive but provided as examples only. The array speaker device may be adjusted in size, as appropriate, depending on the specific apparatus on which the array speaker device is mounted.

In the foregoing embodiments, PZT is used as the piezoelectric material, but another piezoelectric material may be used. Any other piezoelectric material, such as $BaTiO_3$ or $PbTiO_3$, or a piezoelectric single crystal, such as quartz or lithium niobate, may be used. A piezoelectric polymer film, such as zinc oxide (ZnO), vinylidene fluoride, and trifluoroethylene polymers, may also be used.

The hole 4 is in a circular shape in the foregoing embodiments, but may be in another shape such as a rectangle. Likewise, the attachment portion 5 and the cup 15 each may be in another shape such as a polygon, as long as the wavefront of a sound wave can be transformed into a plane.

Amplitude modulation (AM) is used as a method for modulating sound signals in the foregoing embodiments, but frequency modulation (FM) may also be used.

In the foregoing individual embodiments, the MEMS technology is used to produce an array speaker device in which discrete speaker portions 3 are arrayed, but this is not restrictive. The speaker device according to the present disclosure may include only one speaker.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2015-254860, filed on Dec. 25, 2015, the entire disclosure of which is incorporated by reference herein.

INDUSTRIAL APPLICABILITY

The present disclosure can be applied to a speaker that is attached to any of a variety of electrical apparatuses including portable devices such as smart phones, and that is needed to emit sounds such as voices with high directivity.

REFERENCE SIGNS LIST 1A, 1B, 1C, 1D, 1E, 1F, 1G, 1H, 1I, 1J, 1K, 1L, 1M Array speaker device
2 Substrate
3 Speaker portion
4 Hole
5 Attachment portion
10A Support layer
10B BOX layer
11 Base material layer
12 First electrode layer
12A External terminal
13 Piezoelectric element layer
14 Second electrode layer
14A Wiring pattern
14B External terminal 15 Cup
16 Protection film
17 Mask
20 Vibrator
30 Sound signal output device
31 Signal modulator
40, 41, 42, 43, 44 Fastening portion
S Scallops

The invention claimed is:

1. A speaker device comprising:
  a substrate having a uniform thickness;
  a vibrator arranged on one face of the substrate, the vibrator comprising a base material layer, a first electrode layer, a piezoelectric element layer, and a second electrode layer, each of which has a uniform thickness, and which are layered in an order mentioned; and
  a resonator that resonates with the vibration of the vibrator and makes the sound wave outputted in the thickness direction of the substrate closer to a plane parallel to the substrate,
  wherein a hole through which a sound wave is outputted in a thickness direction of the substrate is provided on another face of the substrate at a position corresponding to the vibrator, the sound wave being generated by vibration of the vibrator to which a voltage signal is applied via the first electrode layer and the second electrode layer,
  wherein an attachment portion is provided at a center of the hole, the resonator being attached to the attachment portion,
  wherein scallops made of an indentation and a projection alternating in the thickness direction of the substrate are formed on an inner circumferential wall of the hole, and
  wherein scallops facing the scallops formed on the inner circumferential wall of the hole are formed on an outer circumferential wall of the attachment portion.

2. The speaker device according to claim 1, wherein
  both the hole and the attachment portion are cylindrical, the attachment portion is disposed concentrically with the hole, and
  the resonator is in a form of a cone tapered toward the vibrator and is disposed concentrically with the hole and the attachment portion.

3. The speaker device according to claim 2, wherein the second electrode layer is in a circular shape and is disposed concentrically with the hole, the attachment portion, and the resonator.

4. The speaker device according to claim 1, comprising:
  a plurality of the vibrators,
  wherein the hole is provided at a position corresponding to each of a plurality of the vibrators.

5. The speaker device according to claim 4, wherein the vibrators are arranged at intersections of lines forming a square grid on the substrate.

6. The speaker device according to claim 4, wherein one vibrator is disposed at a center of a circle and surrounding vibrators are equally spaced on a circumference of the circle.

7. The speaker device according to claim 4, wherein the vibrators are arranged so that three vibrators adjacent to one another are positioned at vertices of an equilateral triangle on the substrate.

8. The speaker device according to claim 7,
  wherein a projection and an indentation are provided on an outer edge of the substrate, which is to abut on an outer edge of another adjacent substrate, so as to be engaged with a projection and an indentation on the outer edge of the other substrate when a plurality of the substrates is tiled, and
  wherein the vibrator is provided on the projection of the outer edge so that three vibrators adjacent to one another across the substrates are positioned at vertices of a congruent equilateral triangle with the equilateral triangle.

9. The speaker device according to claim 4, wherein the speaker device is fastened to a fastening target through part of the piezoelectric element layer being exposed on one face of the substrate.

10. The speaker device according to claim 9, wherein the speaker device is fastened to the fastening target through a circular or rectangular portion disposed at an intersection of lines forming a two-dimensional grid that is formed to circumvent the second electrode layer.

11. The speaker device according to claim 9, wherein the speaker device is fastened to the fastening target through an entire portion that is formed to circumvent the second electrode layer.

12. The speaker device according to claim 9, wherein the speaker device is fastened to the fastening target through a portion in a form of a two-dimensional grid that is formed to circumvent the second electrode layer.

13. The speaker device according to claim 1, comprising:
  a first external terminal being an external terminal for the first electrode layer;
  a wiring pattern formed on the substrate so as to electrically connect the second electrode layers that are included in the vibrators arranged on one face of the substrate; and
  a second external terminal being an external terminal for the wiring pattern,
  wherein, when a plurality of the substrates is tiled, the first external terminal is provided at a position opposite to the first external terminal provided on another adjacent substrate, and
  wherein, when a plurality of the substrates is tiled, the second external terminal is provided at a position opposite to the second external terminal provided on another adjacent substrate.

14. A method for manufacturing a speaker device, the speaker device being a speaker device according to claim 1, the method comprising:
  depositing the first electrode layer having a uniform thickness on a base material layer having a uniform thickness in a silicon-on-insulator (SOI) substrate having a uniform thickness;
  depositing the piezoelectric element layer having a uniform thickness on the first electrode layer;
  depositing the second electrode layer having a uniform thickness on the piezoelectric element layer;
  forming an array of vibrators that each include the base material layer, the first electrode layer, the piezoelectric element layer, and the second electrode layer on one face of the substrate through etching; and
  flipping the substrate, forming (i) the hole, through which a sound wave generated by vibration of the piezoelectric layer to which a voltage signal is applied via the first electrode layer and the second electrode layer is outputted in a thickness direction of the substrate, and (ii) the attachment portion which is provided at a center of the hole and to which the resonator is attached that resonates with the vibration of the vibrator and makes the soundwave outputted in the thickness direction of the substrate closer to a plane parallel to the substrate, at a position corresponding to the vibrator through deep etching performed on another face of the substrate, and forming the scallops made of an indentation and a projection alternating in the thickness direction of the substrate on an inner circumferential wall of the hole and an outer circumferential wall of the attachment portion; and attaching the resonator to the attachment portion.

15. The speaker device according to claim 1 prepared by a process including the steps of:

depositing the first electrode layer having a uniform thickness on a base material layer having a uniform thickness in a silicon-on-insulator (SOI) substrate having a uniform thickness;

depositing the piezoelectric element layer having a uniform thickness on the first electrode layer;

depositing the second electrode layer having a uniform thickness on the piezoelectric element layer;

forming an array of vibrators that each include the base material layer, the first electrode layer, the piezoelectric element layer, and the second electrode layer on one face of the substrate through etching; and flipping the substrate, forming (i) the hole, through which a sound wave generated by vibration of the piezoelectric layer to which a voltage signal is applied via the first electrode layer and the second electrode layer is outputted in a thickness direction of the substrate, and (ii) the attachment portion which is provided at a center of the hole and to which the resonator is attached that resonates with the vibration of the vibrator and makes the soundwave outputted in the thickness direction of the substrate closer to a plane parallel to the substrate, at a position corresponding to the vibrator through deep etching performed on another face of the substrate, and forming the scallops made of an indentation and a projection alternating in the thickness direction of the substrate on an inner circumferential wall of the hole and an outer circumferential wall of the attachment portion; and attaching the resonator to the attachment portion.

\* \* \* \* \*